United States Patent
Wu et al.

(10) Patent No.: US 10,936,003 B1
(45) Date of Patent: Mar. 2, 2021

(54) PHASE LOCKING MULTIPLE CLOCKS OF DIFFERENT FREQUENCIES

(71) Applicant: Seagate Technology LLC, Cupertino, CA (US)

(72) Inventors: Zheng Wu, San Jose, CA (US); Jason Bellorado, San Jose, CA (US); Marcus Marrow, San Jose, CA (US); Trung Thuc Nguyen, San Jose, CA (US); Wing Fai Hui, San Jose, CA (US); Kin Ming Chan, Freemont, CA (US)

(73) Assignee: Seagate Technology LLC, Fremont, CA (US)

( * ) Notice: Subject to any disclaimer, the term of this patent is extended or adjusted under 35 U.S.C. 154(b) by 482 days.

(21) Appl. No.: 15/803,672

(22) Filed: Nov. 3, 2017

Related U.S. Application Data

(60) Provisional application No. 62/522,248, filed on Jun. 20, 2017.

(51) Int. Cl.
*G06F 1/08* (2006.01)
*G06F 1/12* (2006.01)
*H03L 7/07* (2006.01)
*H03L 7/093* (2006.01)
*H03L 7/095* (2006.01)

(52) U.S. Cl.
CPC ............... *G06F 1/08* (2013.01); *G06F 1/12* (2013.01); *H03L 7/07* (2013.01); *H03L 7/093* (2013.01); *H03L 7/095* (2013.01)

(58) Field of Classification Search
CPC combination set(s) only.
See application file for complete search history.

(56) References Cited

U.S. PATENT DOCUMENTS

| | | |
|---|---|---|
| 5,321,564 A | 6/1994 | Takahashi |
| 5,461,644 A | 10/1995 | Bermans et al. |
| 5,543,978 A | 8/1996 | Park |
| 5,621,769 A | 4/1997 | Wan et al. |
| 5,654,765 A | 8/1997 | Kim |

(Continued)

OTHER PUBLICATIONS

Bellorado et al., "Target Parameter Adaptation", U.S. Appl. No. 15/334,167, filed Oct. 25, 2016, Seagate Technology LLC.

(Continued)

*Primary Examiner* — Jaweed A Abbaszadeh
*Assistant Examiner* — Cheri L Harrington
(74) *Attorney, Agent, or Firm* — Kirk A. Cesari; Christian W. Best

(57) ABSTRACT

Systems and methods are disclosed for phase locking multiple clocks of different frequencies. In certain embodiments, an apparatus may be configured to downsample a first clock having a first frequency and a second clock having a second frequency into downsampled clocks having the same frequency. The apparatus may adjust a frequency of the second clock so that the downsampled clocks are phase aligned. The apparatus may reset counters of the divider circuits that perform the downsampling so align them to a counter for the first clock. A counter for the second clock may also be reset to align with the counter for the first clock. The synchronized clocks may be applied in data storage operations, such as self-servo writing operations, where the first clock may be a read clock and the second clock may be a write clock.

20 Claims, 11 Drawing Sheets

(56) References Cited

U.S. PATENT DOCUMENTS

| | | |
|---|---|---|
| 5,742,532 A | 4/1998 | Duyne et al. |
| 5,862,192 A | 1/1999 | Huszar et al. |
| 5,970,093 A | 10/1999 | Lantremange |
| 6,111,712 A * | 8/2000 | Vishakhadatta ..... G11B 19/247 360/51 |
| 6,157,510 A | 12/2000 | Schreck et al. |
| 6,181,213 B1 * | 1/2001 | Chang ................ H03L 7/081 327/156 |
| 6,222,592 B1 | 4/2001 | Patel |
| 6,320,920 B1 | 11/2001 | Beyke |
| 6,377,552 B1 | 4/2002 | Moran et al. |
| 6,396,887 B1 * | 5/2002 | Ware .................... G06F 1/12 327/144 |
| 6,438,185 B1 | 8/2002 | Huttunen |
| 6,505,222 B1 | 1/2003 | Davis et al. |
| 6,519,107 B1 * | 2/2003 | Ehrlich .............. G11B 5/59688 360/75 |
| 6,549,587 B1 | 4/2003 | Li |
| 6,580,676 B1 | 6/2003 | Yanagisawa et al. |
| 6,581,182 B1 | 6/2003 | Lee |
| 6,633,894 B1 | 10/2003 | Cole |
| 6,665,308 B1 | 12/2003 | Rakib et al. |
| 6,670,901 B2 | 12/2003 | Brueske et al. |
| 6,687,073 B1 | 2/2004 | Kupferman |
| 6,697,891 B2 | 2/2004 | Emberty et al. |
| 6,707,772 B1 | 3/2004 | Marrec et al. |
| 6,738,205 B1 | 5/2004 | Moran et al. |
| 6,738,215 B2 | 5/2004 | Yatsu |
| 6,950,258 B2 | 9/2005 | Takaishi |
| 6,993,291 B2 | 1/2006 | Parssinen et al. |
| 7,046,701 B2 | 5/2006 | Mohseni et al. |
| 7,085,330 B1 | 8/2006 | Shirali |
| 7,133,233 B1 | 11/2006 | Ray et al. |
| 7,133,239 B1 * | 11/2006 | Hartman ............ G11B 5/59638 360/75 |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,440,208 B1 | 10/2008 | McEwen et al. |
| 7,929,238 B1 | 4/2011 | Vasquez |
| 7,940,667 B1 | 5/2011 | Coady |
| 7,948,703 B1 | 5/2011 | Yang |
| 8,027,117 B1 * | 9/2011 | Sutardja ............. G11B 5/59633 360/51 |
| 8,139,301 B1 | 3/2012 | Li et al. |
| 8,160,181 B1 | 4/2012 | Song et al. |
| 8,172,755 B2 | 5/2012 | Song et al. |
| 8,296,637 B1 | 10/2012 | Varnica et al. |
| 8,400,726 B1 | 3/2013 | Wu et al. |
| 8,456,977 B2 | 6/2013 | Honma |
| 8,479,086 B2 | 7/2013 | Xia et al. |
| 8,508,879 B1 * | 8/2013 | Zou ................... G11B 5/59616 360/51 |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,543,894 B1 | 9/2013 | Varnica et al. |
| 8,713,413 B1 | 4/2014 | Bellorado et al. |
| 8,724,245 B1 | 5/2014 | Smith et al. |
| 8,755,139 B1 | 6/2014 | Zou et al. |
| 8,760,794 B1 | 6/2014 | Coker et al. |
| 8,767,341 B1 | 7/2014 | Coker et al. |
| 8,780,477 B1 | 7/2014 | Guo et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,887,033 B1 | 11/2014 | Varnica et al. |
| 8,953,276 B1 | 2/2015 | Pokharel et al. |
| 9,007,707 B1 | 4/2015 | Lu et al. |
| 9,019,642 B1 | 4/2015 | Xia et al. |
| 9,025,269 B1 | 5/2015 | Wong et al. |
| 9,064,537 B1 | 6/2015 | Nie |
| 9,082,418 B2 | 7/2015 | Ong et al. |
| 9,093,115 B1 | 7/2015 | Fung et al. |
| 9,099,132 B1 | 8/2015 | Grundvig et al. |
| 9,129,650 B2 | 9/2015 | Mathew et al. |
| 9,147,416 B2 | 9/2015 | Grundvig et al. |
| 9,189,315 B1 | 11/2015 | Varnica et al. |
| 9,196,298 B1 | 11/2015 | Zhang et al. |
| 9,245,578 B1 | 1/2016 | Wang et al. |
| 9,245,579 B2 | 1/2016 | Song et al. |
| 9,245,580 B1 | 1/2016 | Lu et al. |
| 9,246,668 B1 | 1/2016 | Yu et al. |
| 9,257,135 B2 | 2/2016 | Ong et al. |
| 9,257,145 B1 | 2/2016 | Soderbloom et al. |
| 9,286,915 B1 | 3/2016 | Dziak et al. |
| 9,311,937 B2 | 4/2016 | Zou et al. |
| 9,311,959 B1 | 4/2016 | Fan et al. |
| 9,385,757 B1 | 7/2016 | Nangare |
| 9,401,161 B1 | 7/2016 | Jury |
| 9,424,878 B1 | 8/2016 | Dziak et al. |
| 9,431,052 B2 | 8/2016 | Oberg et al. |
| 9,489,976 B2 | 11/2016 | Jury et al. |
| 9,508,369 B2 | 11/2016 | Chu et al. |
| 9,536,563 B1 | 1/2017 | Liu et al. |
| 9,542,972 B1 | 1/2017 | Nayak et al. |
| 9,564,157 B1 | 2/2017 | Trantham |
| 9,590,803 B2 | 3/2017 | Derras et al. |
| 9,645,763 B2 | 5/2017 | Sankaranarayanan et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 9,998,136 B1 | 6/2018 | Wu |
| 10,014,026 B1 | 7/2018 | Wu et al. |
| 10,152,457 B1 | 12/2018 | Bellorado |
| 10,164,760 B1 | 12/2018 | Bellorado et al. |
| 10,177,771 B1 | 1/2019 | Bellorado et al. |
| 10,180,868 B2 | 1/2019 | Alhussien et al. |
| 10,276,233 B1 | 4/2019 | Danjean et al. |
| 10,297,281 B1 | 5/2019 | Bellorado et al. |
| 10,469,290 B1 | 11/2019 | Marrow et al. |
| 10,498,565 B1 | 12/2019 | Azenkot et al. |
| 2002/0080898 A1 | 6/2002 | Agazzi et al. |
| 2002/0181439 A1 | 12/2002 | Orihashi et al. |
| 2003/0185114 A1 * | 10/2003 | Liaw .................... G11B 19/28 369/47.3 |
| 2003/0198152 A1 * | 10/2003 | Morishima ....... G11B 20/10009 369/47.3 |
| 2003/0198165 A1 | 10/2003 | Mouri et al. |
| 2004/0101068 A1 | 5/2004 | Wang et al. |
| 2004/0228397 A1 | 11/2004 | Bach |
| 2005/0117243 A1 | 6/2005 | Serizawa |
| 2005/0270687 A1 | 12/2005 | Zweighaft |
| 2006/0214708 A1 * | 9/2006 | Huang .................... H03L 7/183 327/156 |
| 2006/0215290 A1 | 9/2006 | Kurtas et al. |
| 2007/0139805 A1 | 6/2007 | Mead |
| 2007/0139806 A1 | 6/2007 | Southerland et al. |
| 2007/0177292 A1 | 8/2007 | Bui et al. |
| 2008/0007855 A1 | 1/2008 | Vityaev et al. |
| 2008/0158711 A1 | 7/2008 | Bliss et al. |
| 2008/0175309 A1 | 7/2008 | Fimoff et al. |
| 2009/0028252 A1 | 1/2009 | Lu |
| 2009/0097606 A1 | 4/2009 | Hutchins et al. |
| 2009/0141386 A1 | 6/2009 | Miura |
| 2009/0262870 A1 | 10/2009 | Ashbrook et al. |
| 2009/0323214 A1 | 12/2009 | Grundvig et al. |
| 2010/0290153 A1 | 11/2010 | Hampshire |
| 2011/0002375 A1 | 1/2011 | Honma |
| 2011/0072335 A1 | 3/2011 | Liu et al. |
| 2011/0090773 A1 | 4/2011 | Yu et al. |
| 2011/0176400 A1 | 7/2011 | Gerasimov |
| 2012/0082018 A1 * | 4/2012 | Gushima ............. G11B 7/0045 369/44.39 |
| 2012/0105994 A1 | 5/2012 | Bellorado et al. |
| 2012/0155577 A1 | 6/2012 | Shukla et al. |
| 2013/0076433 A1 | 3/2013 | Fratti |
| 2013/0201838 A1 | 8/2013 | Homchaudhuri et al. |
| 2014/0009192 A1 * | 1/2014 | Suzuki .................... H03L 7/095 327/115 |
| 2014/0035638 A1 * | 2/2014 | Bode .................... H03L 7/183 327/156 |

(56) References Cited

U.S. PATENT DOCUMENTS

| | | |
|---|---|---|
| 2014/0223114 A1 | 8/2014 | Wang et al. |
| 2015/0003221 A1 | 1/2015 | Sankaranarayanan et al. |
| 2015/0022916 A1 | 1/2015 | Zou et al. |
| 2015/0279398 A1 | 10/2015 | Fan et al. |
| 2015/0355838 A1 | 12/2015 | Chen et al. |
| 2015/0380048 A1 | 12/2015 | Oberg et al. |
| 2016/0019921 A1 | 1/2016 | Bui et al. |
| 2016/0112218 A1 | 4/2016 | Abe |
| 2016/0164532 A1* | 6/2016 | Zhang .................... H03L 7/183 327/142 |
| 2016/0293205 A1 | 10/2016 | Jury et al. |
| 2016/0351227 A1 | 12/2016 | Koshino |
| 2017/0125089 A1 | 5/2017 | Sankaranarayanan et al. |
| 2017/0125110 A1 | 5/2017 | Sankaranarayanan et al. |
| 2017/0236592 A1 | 8/2017 | Alhussien et al. |
| 2017/0249206 A1 | 8/2017 | Jeong et al. |
| 2018/0011753 A1 | 1/2018 | Alhussien et al. |
| 2018/0012663 A1 | 1/2018 | Alhussien et al. |
| 2018/0277158 A1 | 9/2018 | Kishino |
| 2018/0367164 A1 | 12/2018 | Marrow et al. |
| 2019/0130967 A1 | 5/2019 | Danjean et al. |
| 2020/0065262 A1 | 2/2020 | Bellorado |

OTHER PUBLICATIONS

Guo, Yuanbin, "An Efficient Circulant MIMO Equalizer for CDMA Downlink: Algorithm and VLSI Architecture", Hindawi Publishing Corporation, 2006, pp. 1-18.

Hicks, James, "Overloaded Array Processing with Spatially Reduced Search Joint Detection", Virginia Polytechnic Institute & State University, May 10, 2000, pp. 1-144.

Mohammad, Maruf, "Blind Acquisition of Short Burst with Per-Survivor Processing (PSP)", Virginia Polytechnic Institute & State University, Nov. 26, 2002, pp. 1-127.

Nechaev, Y. B., et al., "Increasing Efficiency of Information Transmission with Interference Influence by the Use of Multi-Parameter Adaptation", East-West Design & Test Symposium (EWDTS 2013), Rostov-on-Don, 2013, pp. 1-4 (Year: 2013).

* cited by examiner

PHASE LOCKING MULTIPLE CLOCKS OF DIFFERENT FREQUENCIES

CROSS-REFERENCE TO RELATED APPLICATION

The present application is a non-provisional application of and claims priority to U.S. provisional patent application, Application No. 62/522,248, filed Jun. 20, 2017, entitled "MISO Systems and Methods", the contents of which are hereby incorporated by reference in their entirety.

SUMMARY

In certain embodiments, an apparatus may comprise a data channel including a clock synchronization module (CSM) having a first clock circuit, a second clock circuit, a first digital divider circuit, a second digital divider circuit, and a phase lock loop. The first clock circuit may be configured to produce a first clock signal having a first frequency, and the second clock circuit may be configured to produce a second clock signal having a second frequency different from the first frequency. The first digital divider circuit may be configured to downsample the first clock signal to produce a first downsampled clock signal having a third frequency, and the second digital divider circuit may be configured to downsample the second clock signal to produce a second downsampled clock signal having the third frequency. The phase lock loop may be configured to synchronize phases of the first downsampled clock signal and the second downsampled clock signal by adjusting a phase of the second clock signal via the second clock circuit based on a phase error between the first downsampled clock signal and the second downsampled clock signal. The data channel may be configured to perform data access to a memory after synchronization using the first clock signal and the second clock signal.

In certain embodiments, an apparatus may comprise a data channel including a clock synchronization module (CSM) having a first digital divider circuit, a second digital divider circuit, and a phase lock loop. The first digital divider circuit may be configured to downsample a first clock signal having a first frequency to produce a first downsampled clock signal having a third frequency, and the second digital divider circuit may be configured to downsample a second clock signal having a second frequency to produce a second downsampled clock signal having the third frequency. The phase lock loop may be configured to synchronize phases of the first downsampled clock signal and the second downsampled clock signal by adjusting a phase of the second clock signal based on a phase error between the first downsampled clock signal and the second downsampled clock signal. The data channel may be configured to perform data access to a memory after synchronization using the first clock signal and the second clock signal.

In certain embodiments, a method may comprise downsampling a first clock signal having a first frequency via a first digital divider circuit to produce a first downsampled clock signal having a third frequency, and downsampling a second clock signal having a second frequency via a second digital divider circuit to produce a second downsampled clock signal having the third frequency. The method may comprise synchronizing phases of the first downsampled clock signal and the second downsampled clock signal via a phase lock loop circuit by adjusting a phase of the second clock signal based on a phase error between the first downsampled clock signal and the second downsampled clock signal. The method may comprise performing data access to a memory after synchronization using the first clock signal and the second clock signal.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
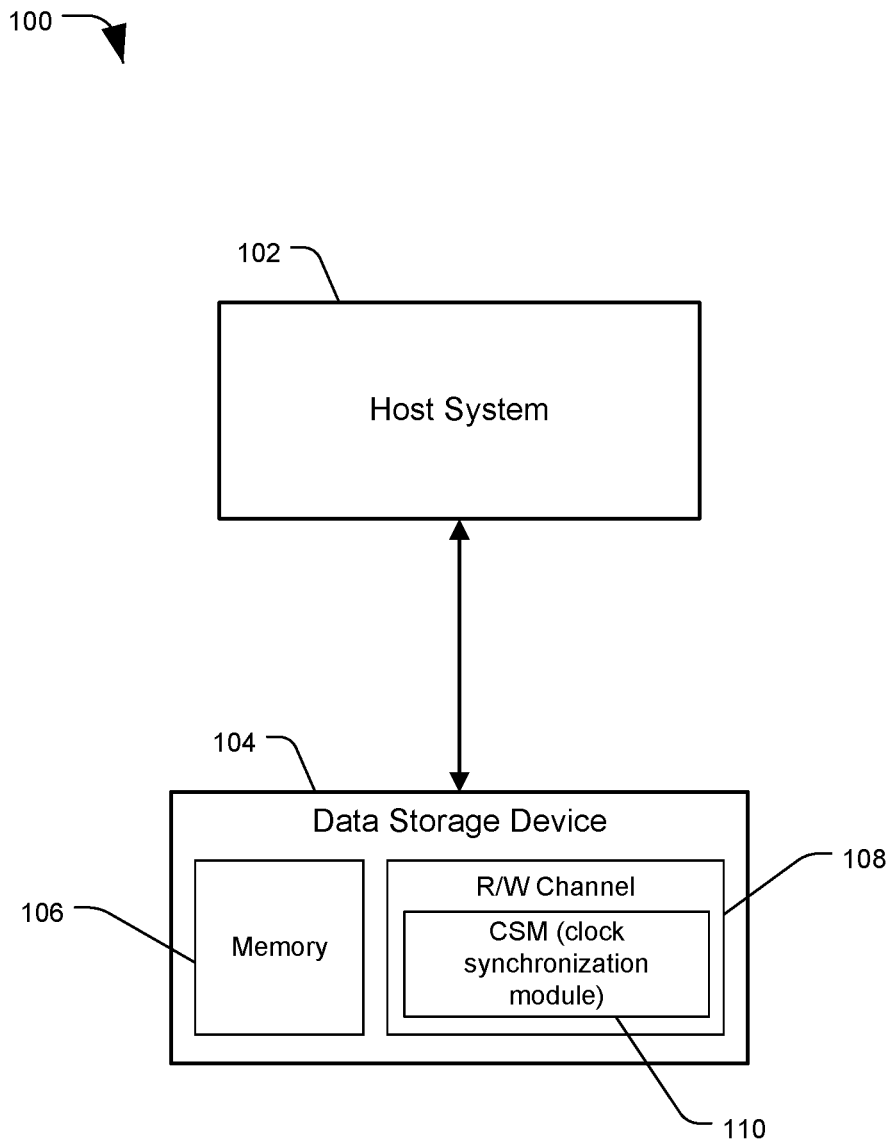
FIG. 1 is a diagram of a system configured for phase locking multiple clocks of different frequencies, in accordance with certain embodiments of the present disclosure.

FIG. 1 is a diagram of a system configured for phase locking multiple clocks of different frequencies, generally designated 100, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a hard disc drive (HDD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a read/write (R/W) channel 108. The memory 106 may include a non-volatile data storage medium, which may include a magnetic storage medium such as a hard disc, other nonvolatile storage mediums, or any combination thereof. The R/W channel 108 may comprise one or more circuits or processors configured to process signals for recording to or reading from the memory 106. During operation, the DSD 104 may receive a data access request, such as a read or write request, from the host device 102. In response, the DSD 104 may perform data access operations on the memory 106 via the R/W channel 108 based on the request.

The DSD 104 may retrieve data from the memory 106 as one or more analog signals, e.g. using one or more receivers, such as reader elements or heads, to detect magnetic signals from tracks of a disc. The R/W channel 108 may perform processing on the analog signals to detect a digital bit sequence representing stored data. Similarly, the DSD 104 may store data to the memory 106 by using reader elements or heads to generate magnetic fields and set localized polarity of the disc surface, which in turn can be read as analog signals. The R/W channel 108 may convert a digital bit sequence into an analog magnetic signal for storing data to the disc.

A DSD 104 may have multiple clock signal generators to control the timing of operations and signals within the device. For example, the DSD 104 may have a read clock to control a read head, and a write clock to control a write head, and each clock may have a different frequency (e.g. how quickly it produces timing pulses). There are various reasons that it may be advantageous to synchronize clocks having different frequencies (e.g. via phase-locking the clocks), so that there is a known fixed relationship between the clocks. Accordingly, the DSD 104 may include a clock synchronization module (CSM) 110 to perform the operations described herein to synchronize two or more clocks having different frequencies. The CSM 110 may be located within the R/W channel 108, separate from the R/W channel, or partially within the R/W channel and partially distributed elsewhere. In this manner, the functioning of the DSD 104 may be improved by providing the ability to accurately and precisely synchronize multiple clocks having different frequencies, allowing for the performance of synchronized operations that include the multiple different clocks. For example, applications that rely on read and write heads being carefully synchronized may benefit from the described methodology. One such application may be the performance of self-servo writing (SSW), in which the DSD 104 uses its heads to write servo data to the disc surface which is then used for head positioning during normal data input/output (I/O) read and write operations. An example depiction of servo data and an associated servo writing process are described in regard to FIG. 2.

Figure 2:
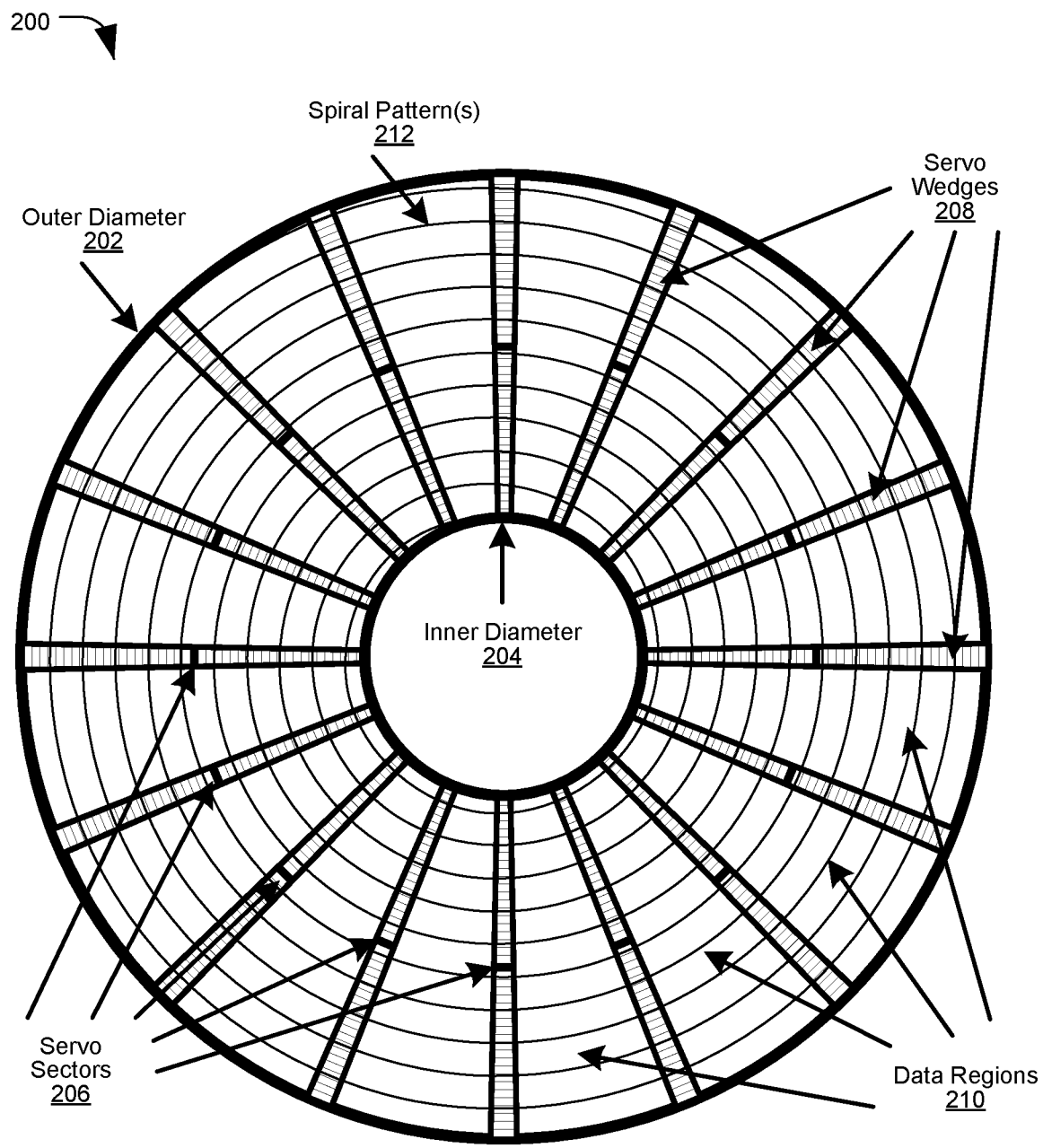
FIG. 2 is a diagram of a system configured for phase locking multiple clocks of different frequencies, in accordance with certain embodiments of the present disclosure.

FIG. 2 is a diagram of a system configured for phase locking multiple clocks of different frequencies, in accordance with certain embodiments of the present disclosure. The system may include a surface of an example magnetic disc storage medium 200, such as the memory 106 of DSD 104 of FIG. 1.

Data may be stored to a disc memory 200 along very narrow concentric bands called tracks. There may be hundreds of thousands of tracks on a single disc surface, and so the DSD may need to be extremely precise in positioning the heads over a correct track when performing reading and writing operations. In order to know where the heads are currently located (e.g. over which track), the DSD may read servo positioning information stored to the disc.

As stated, the disc 200 may be configured to record data (e.g. host or user data) to a multitude of concentric circular data tracks (or just "tracks") arranged from an outer diameter 202 to an inner diameter 204 of the disc 200. The disc 200 may spin about a central spindle located at the inner diameter 204. A read or write head may be positioned above the surface of the disc 200, and can read or write data to the tracks while the disc 200 spins below the head. A hard disc surface may include servo signals written during manufacture procedures, which the DSD may use to determine a head's positioning relative to tracks and the disc. The head and channel can look for these servo signals to locate the data tracks, where the user data will be read or written. Each track may include portions devoted to user data and portions reserved for the servo signals. During a manufacturing process for the DSD, the servo signals can be written to a disk through a multi-disc writer (MDW, a machine that can write dedicated patterns, such as servo patterns, or spiral signals), or they can be written through a procedure called self-servo write (SSW).

As explained herein, the storage and subsequent retrieval of data from a hard disc drive may be made possible by the demodulation of servo signals from a servo pattern, which may be written to the surface of each disc 200 during manufacturing. As shown in FIG. 2, the servo pattern may consist of a multitude of radially-oriented servo wedges 208 oriented from the inner diameter (ID) 204 to the outer diameter (OD) 202, and spaced evenly about the circumference of the disc 200. Each servo wedge 208 can include a plurality of servo sectors 206, arranged radially with one servo sector 206 nearest to the ID 204, the next servo sector 206 adjacent to that, and so on out to a last servo sector 206 nearest to the OD 202. The servo sectors 206 may define concentric circular tracks, where each track includes a multitude of servo sectors 206 written at an (approximately) equal radius and spaced uniformly around the disk (e.g. a track may be composed of all sectors with an equivalent track ID (TID)). An example track may be defined by the servo sectors 206 shaded black in FIG. 2, all at approximately the same radial distance from the center of the disc 200. Data can be stored to portions of the concentric data tracks in the data regions 210 located between each servo wedge 208. While the disc 200 spins below a read head, the head may follow the servo signal from servo sectors 206 to attempt to remain centered over a track and read the user data stored to the data regions 210. While following a track, a head may detect a recurrent sequence of a servo sector 206 followed by one or more data sectors within the data region 210, followed by another servo sector 206 and so on.

The data contained within each servo sector 206 may specify its physical radial and tangential locations. As the read head passes over each servo sector 206, the servo sector's information may be demodulated such that the position of the read head is always known to the hard-disk controller (the position of the write-head may also be inferred). Furthermore, the spacing between servo sectors 206 can be utilized to modulate the frequency of clocks used for all write and read operations such that the frequencies remain consistent relative to the rotational velocity of the disc 200. It is this processing of the servo pattern which allows for consistent writes and reliable reads from a hard disc drive. Although a simplified example is provided in FIG. 2, an actual hard disc 200 may have considerably more servo wedges 208 and servo sectors 206 than in the depicted embodiment. Accordingly, due to the density of data tracks and servo information stored to the disc 200, extremely precise positioning of the servo data may be important to the proper functioning of a DSD.

The writing procedure of the servo pattern can be performed by a dedicated machine known as a servowriter, disc writer, STW (servo track writer), MDW, or MDSW (multi-disk servo writer), where the servo patterns are written to the discs before the discs are assembled into the drive. A servowriter may be a very precise and expensive piece of equipment, and therefore it may be advantageous to use as efficiently as possible to improve manufacturing throughput and reduce overhead. Using a servowriter to write every servo wedge 208 of every disc 200 may be slow and inefficient.

Another way to write the servo pattern is called self-servo write (SSW). A drive employing SSW techniques may utilize its embedded controller and its own write heads to write the servo wedges and associated servo sectors 206 to the surface(s) of its constituent disc(s), thus saving cost and time. In order to accurately position the servo patterns on the disc 200, the controller may determine the position of the heads by locking on to a pre-written (e.g. written using a STW) or self-written pattern on the disc 200 called spirals 212. The spirals 212 may be written to include a sync mark data pattern that can be used to determine when a spiral is encountered by a read head. Writing the spirals 212 may include moving a write head in a controlled manner (e.g. at a constant velocity) from the outer diameter 202 to the inner diameter 204 (or vice versa) as the disc 200 is spun to create the spiral pattern 212. Although a single spiral pattern 212 is depicted in FIG. 2, a plurality of spirals may be written to the disc 200 at consistent or equidistant intervals. Generally a single spiral will cross each radial distance of the disc only once, and so it will cross where each track will eventually be written only once. Writing a number of spiral patterns 212 may be a much faster operation to perform with a servowriter than individually writing each servo wedge 208. However, the data storage device must then be able to use the spiral pattern 212 to accurately and precisely write the servo patterns that will define the track locations and ultimately be used during device I/O operations.

The DSD may read the spirals 212 with the read head and lock the read clock based on the spirals 212. However, the servo patterns will be written with a write head and an associated write clock, and the frequency of the read clock and the write clock could be very different. In order to achieve radial coherence of the servo patterns, the radial location where servo signals are written to the disk for each track should be consistent. In other words, the write gate position should have a fixed relationship to the place where the spiral signals 212 are. This relationship should also be repeatable if the SSW procedure is restarted. Therefore, the write clock should be synchronized to the read clock such that the clock cycles have a known relationship.

One approach may be to set the frequency of the read and write clocks to be the same for SSW, or to have a simple fixed relationship such as 2× or 4×, such that one clock source can be used for both reading and writing after the application some digital dividers, sometimes called frequency dividers. A digital divider may be a circuit that receives an input signal of a frequency $f_{in}$ and generates an output signal of frequency $f_{out}$, where $f_{out}=f_{in}/n$, where "n" may be an integer. However, with the servo frequency going up and zoned servo techniques being used, it may be difficult to maintain such a simple relationship between the read and write clocks. The servo frequency may refer to the clock frequency of the servo pattern, and may determine the physical bit width on the disc. The higher the frequency, the tighter the bits may be written together, assuming the same rotation speed of the disc.

The methodology proposed herein can work for a much larger range of read and write clock frequency relationships, and can support finer granularity. The methodology can include providing clocks that both have an integer number of clock cycles in a selected period; e.g. the clock cycle ratio of the two clocks is a rational number. In SSW there should be an integer number of clock cycles in a single disc revolution for both servo and spiral signals, and so the clocks may be configured for an integer number of clock cycles per revolution in any event.

The proposed methodology could even allow for synchronizing multiple write clocks running at different frequencies to one read clock, via a duplication of the described circuits. This technique can make it possible to write multiple disc surfaces with servo patterns simultaneously or in a staggered fashion, thus greatly reducing servo writing time. An example embodiment of a system configured for synchronizing clocks is described in regard to FIG. 3.

Figure 3:
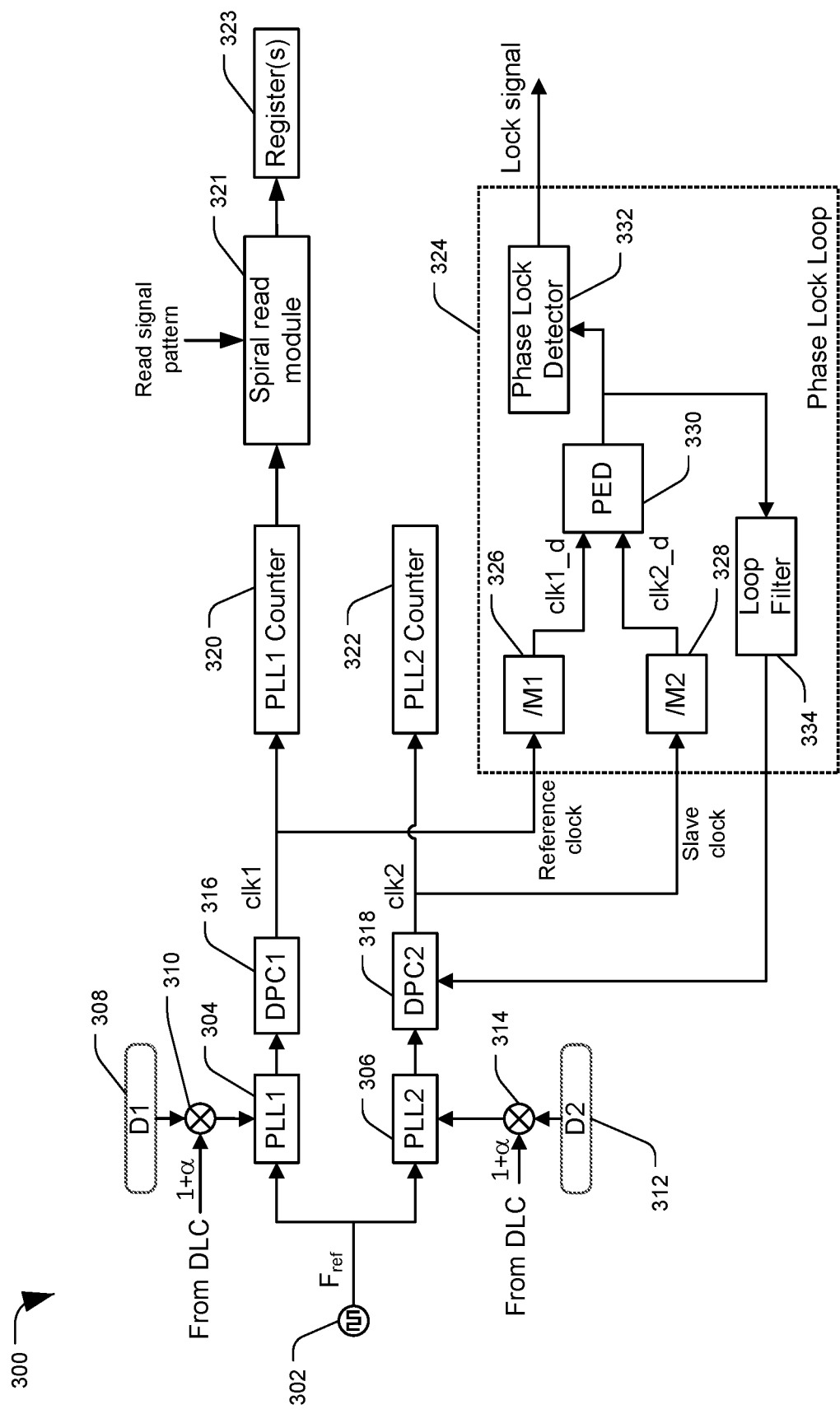
FIG. 3 is a diagram of a system configured for phase locking multiple clocks of different frequencies, in accordance with certain embodiments of the present disclosure.

FIG. 3 is a diagram of a system configured for phase locking multiple clocks of different frequencies, generally designated 300, in accordance with certain embodiments of the present disclosure. The system 300 may include an example clock synchronization module (CSM) within a read/write (R/W) channel, such as the CSM 110 of FIG. 1.

The system 300 may include a reference clock signal $F_{ref}$ 302, which may be provided to a first phase-locked loop (PLL), PLL1 304, and a second PLL, PLL2 306. Both PLLs can be adjusted by the same clock frequency control signal 1+α from a disc-locked clock (DLC). The DLC can be a control algorithm, circuit, or firmware which locks clocks to a written pattern on the disc (e.g. servo signal patterns, or in the case of SSW, the spiral pattern). In normal read and write operations, the servo signal can be read to obtain sync-mark and other track information. The sync-mark position can be compared for each servo sector. If the distance between two adjacent servo sectors is different from an expected number of clock cycles, a timing error can be generated indicating the clock is running faster or slower than needed to match the disc read back signal. This error can be passed to an algorithm to control the alpha value. In turn, changing the alpha value can change the clock frequencies such that clock cycles between two servo sectors are changed. This feed-back loop (DLC, or sometimes called a disc lock loop DLL) may converge when the average clock cycles between servo sectors are as expected.

Accordingly, the 1+α clock frequency control signal can provide the same alpha value to both PLLs, and can modulate the frequency of the PLLs by the same percentage. For example, if a disc is spinning a little bit faster than expected, with the alpha value fed back from a servo channel the data read and write clocks and the servo clock can be sped up with the same percentage to catch up with the disc.

The clock frequency control signal applied to each PLL may be modified by a multiplier value "D". PLL1 304 may be modified by a first multiplier value D1 308 at a first multiplier node 310. Similarly, PLL2 306 may be modified by a second multiplier value D2 312 at a second multiplier node 314. The signals output from PLL1 304 and PLL2 306 may be the clock signals for a first clock and a second clock, respectively. Each PLL may be connected to a digital phase converter (DPC), with PLL1 304 connected to DPC1 316, and PLL2 306 connected to DPC2 318. The digital phase converters can adjust the phase of the respective clock signals with a digital control. For example, a DPC can have an input of 6-bit unsigned number to indicate the clock's phase, with granularity of $1/2^6 T$ (with "T" being a single clock cycle). The DPCs may output phase adjusted clock signals, with DPC1 316 outputting the signal clk1 for the first clock, and with DPC2 318 outputting clk2 for the second clock. As stated herein, clk1 and clk2 may be clock signals with different frequencies. As the signals clk1 and clk2 are produced by PLLs and modified by DPCs, the combination of PLL1 304 and DPC1 316 may be referred to as a first clock, clock circuit, or clock generation circuit, and the combination of PLL2 306 and PDC 318 may be referred to as a second clock, clock circuit, or clock generation circuit. Although clk1 and clk2 derive from the same reference clock signal $F_{ref}$ 302, the relative phases of the two clocks may still be uncertain.

Each clock may be connected to a modulo-counter (or, e.g., a pair or set of modulo-counters), with clock 1 (clk1) connected to PLL1 counter 320, and clock 2 (clk2) connected to PLL2 counter 322. A modulo-counter may count from an initial value to an end value and then reset to the initial value to continue counting. For example, assume that there are a total of 1000 read clock cycles in a single disc revolution. A modulo-counter can be set such that it counts up by one for each clock cycle, from 0 to 999, and then resets to 0 again on the next clock cycle. Another configuration may be to have a pair of counters for each clock. A first modulo-counter of the pair may count the cycles from servo wedge to servo wedge, while the other counter may count the number of wedges. For example, if a disc has 8 wedges and each wedge corresponds to 125 read clock cycles, the cycle counter may count from 0 to 124, while the wedge counter may count from 0 to 7. For the convenience of explanation, the provided examples will include only one counter for each clock. In an embodiment directed to SSW, the modulo-counters may be used to generate a "timestamp" when spirals are encountered by a read head, which timestamps can be used to determine a location of the heads on the disc and where spirals will be encountered on each revolution.

In the scenario of SSW, clock 1 may be the reading clock and clock 2 may be the writing clock. As the reading clock may be used to identify the location of the spiral signals, it may be referred to as the spiral clock. Likewise, the writing clock may be used to write the servo patterns to the disc, and may therefore be referred to as the servo clock.

When the system 300 is reading the signal (e.g. the spiral pattern or servo data) on the disk, the read clock can be locked to the media through disc lock control based on the timestamps given by the signal and PLL1 counter 320. The disc lock control can be accomplished by firmware utilizing the timestamp information provided by the hardware read channel from the PLL1 counter 320. The system 300 may associate a particular timestamp value with the location of a spiral pattern in order to establish the lock. For example, the PLL1 counter 320 may provide a counter output to a spiral read module 321, which may use signal patterns read from the disc to process and detect signal patterns. When the spiral read module 321 detects a sync mark from a spiral pattern, it may record the corresponding counter value or timestamp from the PLL1 counter 320 to one or more registers 323. The system 300 firmware can read the values from the registers 323 to know where spiral patterns are located. When the read clock is locked to the disc, each read counter value may correspond to one unique position on the track within one revolution. The disc lock procedure may be repeatable, so that a particular counter value can always map to the same position on the drive even after resets. The system may have various ways to distinguish different spirals along the track so that the same position can be located again. For example, one of the spirals can have a different sync mark than the rest, so that when this particular sync mark is detected, the system knows that this particular spiral was met and can use it as a reference point.

When writing servo patterns to the disc, the write counter (PLL2 counter 322) can be used to give the writing location over one revolution. In order to be able to write at exactly the same radial location for adjacent tracks (e.g. to achieve the radially-oriented "spoke" arrangement of the servo wedges across the disc surface, called radial coherence), the PLL2 counter 322 values can be used to identify a specific position uniquely on the disk in one revolution. However, only the read clock may be locked to the disc via the read counter 320 and spiral pattern locations, and the read counter 320 and the write counter 322 may be in different clock domains. The write circuit may have to use the read counter 322, or else there will be uncertainty in the system 300 operation. Therefore, identifying unique points along a track using the PLL2 write counter 322 can be accomplished by fixing the phase relationship between the write counter 322 and the read counter 320, thereby synchronizing the write clock to the read clock. An example of a fixed phase relationship is depicted in FIG. 4.

Figure 4:
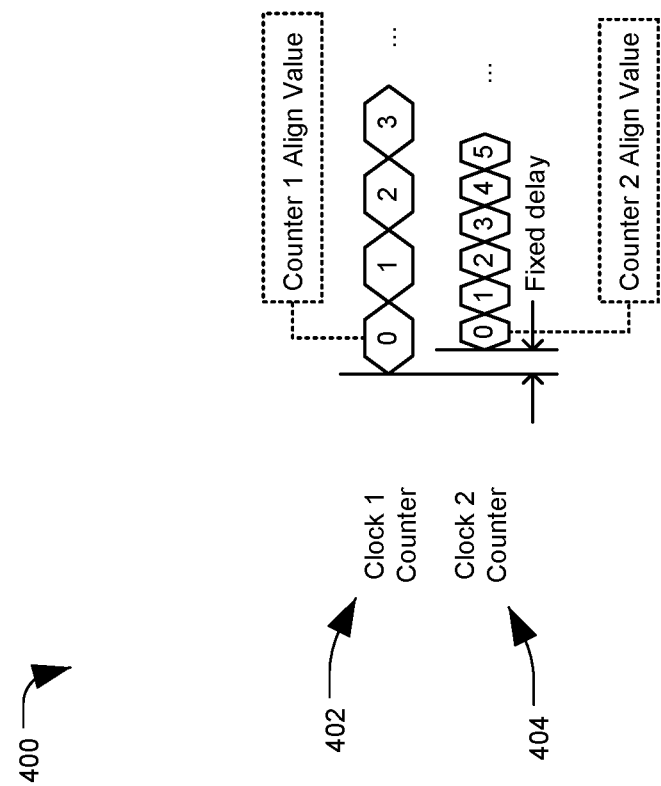
FIG. 4 is a diagram of clock counter values from a system configured for phase locking multiple clocks of different frequencies, in accordance with certain embodiments of the present disclosure.

FIG. 4 is a diagram of clock counter values from a system configured for phase locking multiple clocks of different frequencies, generally designated 400, in accordance with certain embodiments of the present disclosure. Diagram 400 shows incrementing counter values from a clock 1 counter (e.g. PLL1 counter 320 of FIG. 3) and a clock 2 counter (e.g. PPL2 counter 322 of FIG. 3). The size of the counter values along the x-axis may represent the time between the counter incrementing (e.g. one clock cycle of the respective clock), and may therefore reflect the frequency of the corresponding clock. In the depicted embodiment, the clock 1 counter values 402 are larger, and therefore clock 1 may have a lower frequency than clock 2, as represented by the smaller clock 2 counter values 404.

Clock 1 and clock 2 of FIG. 4 may be synchronized and have a fixed phase relationship. Synchronization between two clocks of different frequencies may be defined using a rational ratio: when two clocks are synchronized, the values of the modulo-counters of the two clocks may have a fixed phase relationship. As an example shown in FIG. 4, a given value of clock 1 counter (the Counter 1 align value) is aligned in time with a given value of clock 2 counter (the counter 2 align value), excluding a fixed delay. All the counter values will have fixed phase relationship between clock 1 counter 402 and clock 2 counter 404. For example, the next time clock 1 counter is reset to zero, the clock 2 counter will also reset to zero after the same amount of delay. In the depicted embodiment, the clock 1 and clock 2 counters are aligned at the edge of value 0 (e.g. the counter 1 align value is 0 and the counter 2 align value is also 0). The fixed delay may be due to hardware implementation, and may remain consistent ("fixed") within the system. This fixed delay may not change even if the system is turned off or restarted, which means the exact same phase relationship can be obtained whenever the synchronization procedure is run. The details of synchronizing two clocks will be described in further detail by referring back to FIG. 3.

Returning to FIG. 3, the two clock signals, clk1 and clk2, may be generated by two PLLs, PLL1 304 and PLL2 306, respectively. One of the clock signals may be designated as a reference clock (e.g. clk1 in this example), to which the other clock (the slave clock, clk2) may be synchronized or locked. When clock 1 is used as a read clock, while clock 2 is used as a write clock, the location of the signal being read can be used as the reference position. Therefore, the read clock may be used as the reference clock in such a scenario.

The two clocks may operate at two different frequencies. Assume the output frequency "F" of each PLL can be calculated by $F=F_{ref} \times D$, where D is a fractional number setting applied via registers (e.g. via D1 308 and D2 312). There might be DLC control modifying the fractional D values (e.g. the multiplication of $1+\alpha$ and the multipliers D at the multiplier nodes 310 and 314) going into the PLLs as well. In such a scenario, the actual output frequency of the PLL can be written as $F=F_{ref} \times D \times (1+\alpha)$, where D is the register setting to generate the nominal frequency.

Assume that the ratio of the two clock frequencies is M1/M2. In other words, when clock 1 is downsampled by M1 326 (e.g. the frequency of clock 1 is divided by a value M1) and clock 2 is downsampled by M2 328, the two downsampled clocks (clock signals clk1_d and clk2_d) have the same frequency. For example, if clock 1 completes 200 cycles per disc revolution (such that PLL1 counter 320 counts from 0 to 199), and clock 2 completes 292 cycles per disc revolution (such that PLL2 counter 322 counts from 0 to 291), the values of M1 and M2 may be 50 and 73. In this example, 200/50=4, and 292/73=4. In system 300, clock signals from clk1 may be passed to a digital divider M1 326. The digital dividers may function like counters that increment by 1 for each pulse received from the input clock signal. The M1 divider 326 may therefore count from 0 to 49 and then reset to 0. For every 50 clk1 signals received at the divider M1 326, one downsampled clk1_d signal may be generated. In other words, every time the divider M1 rolls over from 49 to 0, it may generate a pulse. Similarly, clk2 may be passed to digital divider M2 328, which may produce one downsampled clk2_d signal for every 73 clk2 signals received. In this manner, the two downsampled signals will share the same frequency, even if the phase of the clk1_d and clk2_d clock signals is not yet aligned.

Therefore, a phase lock loop 324 can be used to synchronize and lock the edges of the two downsampled clocks. In the example system 300, the two downsampled clocks may be passed to a phase error detector (PED) 330. The PED 330 can generate and output a coarse phase error between the two signals. The phase error may, for example, be a +1 or −1 value to indicate the relationship of the clock edges of the input clocks. This phase error may be provided to a loop filter 334, which may generate a phase adjustment to compensate for the phase error. The phase adjustment may be provided to the DPC2 318 of clock 2, in order to adjust clock 2's phase toward alignment with clock 1. Since clock 1 (e.g., the read clock in the example SSW application) may be regarded as a reference clock whose phase is not adjusted, clock 2 may be a slaving clock to clock 1 through this phase locking of the downsampled clocks.

The phase error generated by the PED 330 may also be provided to a phase lock detector 332. The phase lock detector 332 can be used to indicate whether the two downsampled clocks (clk1_d and clk2_d) are locked or not. For example, the phase lock detector 332 may determine that the clocks are locked if the sum or average of a selected number of the phase error values from the PED 330 is lower than a threshold value. A long sequence of +1 or −1 error values may indicate that there is ongoing phase adjustment between the clocks, while a sequence of variable +1 and −1 values may total or average out to approximately 0, indicating the clocks are locked. When the phase lock detector 332 determines that the two downsampled clocks are phase locked, it may generate a lock signal. Once the downsampled clock signals share the same frequency and phase, the counters PLL1 counter 320 and PLL2 counter 322 may be partially aligned, in as much as they may share a fixed relationship due to the locked downsampled clocks. However, it may not be known how the PLL counters are aligned, and the relationship may not be fixed if the SSW operation is restarted. For example, the 0 value for PLL1 counter 320 may be aligned with a 5 on the PLL2 counter 322 during a first operation, and after a reset the 0 value may be aligned with a 17 value, such that there isn't a known correlation between counter values and disc positions for both clocks. So in order to guarantee that every time the two PLL counters will have a known fixed relationship after the synchronization procedure, the PLL counters may be aligned to known reset positions, and therefore fixed disc positions. Accordingly, once the downsampled clocks are locked, the PLL counters may be further aligned, which may provide the ability to determine specific head locations over the disc for precise servo data writing. An overview of the process to synchronize clocks having different frequencies is described in regard to FIG. 5.

Figure 5:
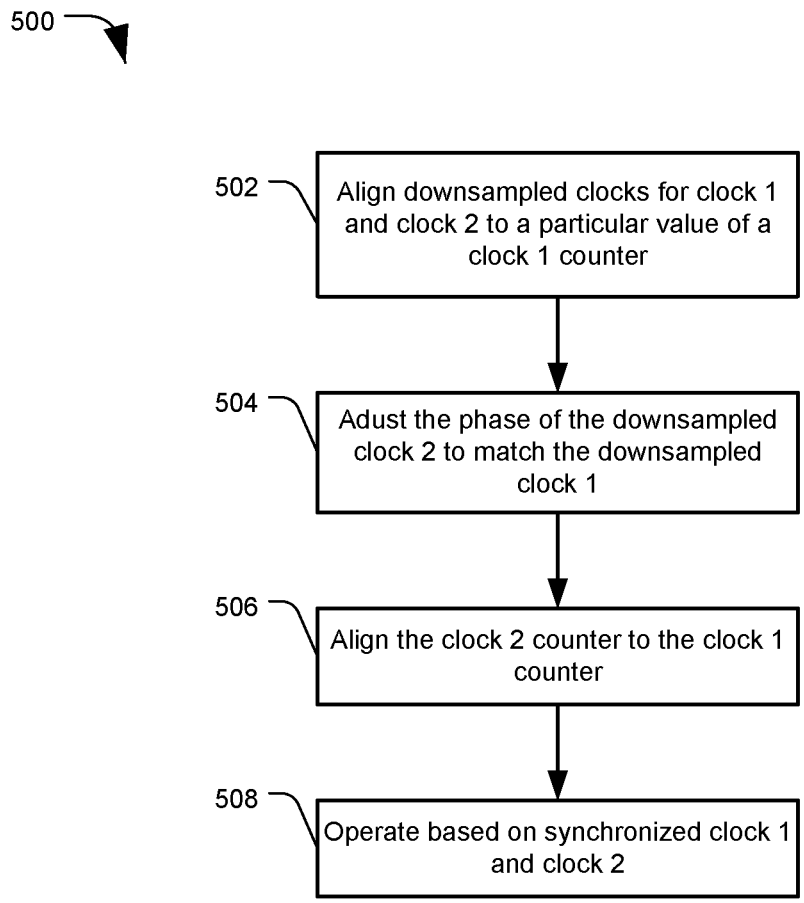
FIG. 5 is a flowchart of a method of phase locking multiple clocks of different frequencies, in accordance with certain embodiments of the present disclosure.

FIG. 5 is a flowchart of a method of phase locking multiple clocks of different frequencies, generally designated 500, in accordance with certain embodiments of the present disclosure. The method 500 may be performed by circuits, computer-executable instructions, or any combination thereof, such as by the clock synchronization module (CSM) 110 depicted in FIG. 1.

Synchronization of two clocks may include phase-adjusting the slave clock to match the reference clock so that their downsampled clocks share the same frequency and phase alignment. The clock counter for the slave clock may then be reset based on the reference clock counter so that both clock counters are aligned, such that clock counter values from either counter may correspond to a specific location on a disc surface.

The method 500 may include aligning one pulse of the downsampled clock signals for a first clock (clock 1) and a second clock (clock 2) to a particular value of the clock 1 modulo counter (e.g. PLL1 counter 320 of FIG. 3), which may correspond to a particular position or location on the disc, at 502. The particular value to which to align the downsampled clocks may be the counter 1 align value, e.g. the value 0 as shown in FIG. 4. Aligning the downsampled clocks to the clock 1 counter may include resetting the digitial divider counters for downsampling so that each resets to 0 when the clock 1 counter reaches the align value. This may result in the downsampled clocks having a clock pulse at the align value of the clock 1 counter. The downsampled clocks may now have the same frequencies and their digital dividers may be aligned to the clock 1 counter, but the clocks may still be offset in phase.

The method 500 may include adjusting the phase of the downsampled clock 2 to match the phase of the downsampled clock 1, at 504. This can be achieved via a phase lock loop, by providing the output of the digital dividers (e.g. the clk1_d and clk2_d signals) to a phase error detector, and using a loop filter to adjust the phase of the clock 2 signal until the clk2_d signal aligns in phase with the clk1_d signal.

Once the downsampled clocks are phase aligned, the method 500 may include aligning the clock 2 counter (e.g. PLL2 counter 322 of FIG. 3) to the clock 1 counter, at 506. This may include resetting the clock 2 counter so that counter 2 resets to the counter 2 align value (e.g. the value 0 as shown in FIG. 4) at approximately the exact same position that counter 1 resets to the counter 1 align value. At this position, the downsampled clocks will each produce a pulse which can be used in the clock 2 counter domain for the resetting. This may include setting counter 2 to the "counter 2 align value +X" at this position, with "X" being some number of clock 2 clock cycles before counter 2 can be reset. For example, if it will take a single clock 2 cycle to implement the reset, the counter 2 may be reset to the value "1" so that the 0 align values of counter 1 and counter 2 will be aligned. The clocks may be synchronized at this point, so that counter values for clock 2 will reliably correspond to specific locations on the disc for each revolution, thus locking clock 2 to the disc just as clock 1 is locked to the disc.

At 508, the method 500 may include operating the system based on the synchronized clock 1 and clock 2. Operations may include data access operations such as reading or writing data, including performing a self servo writing operation. An example illustration of the steps of method 500 are depicted in FIG. 6.

Figure 6:
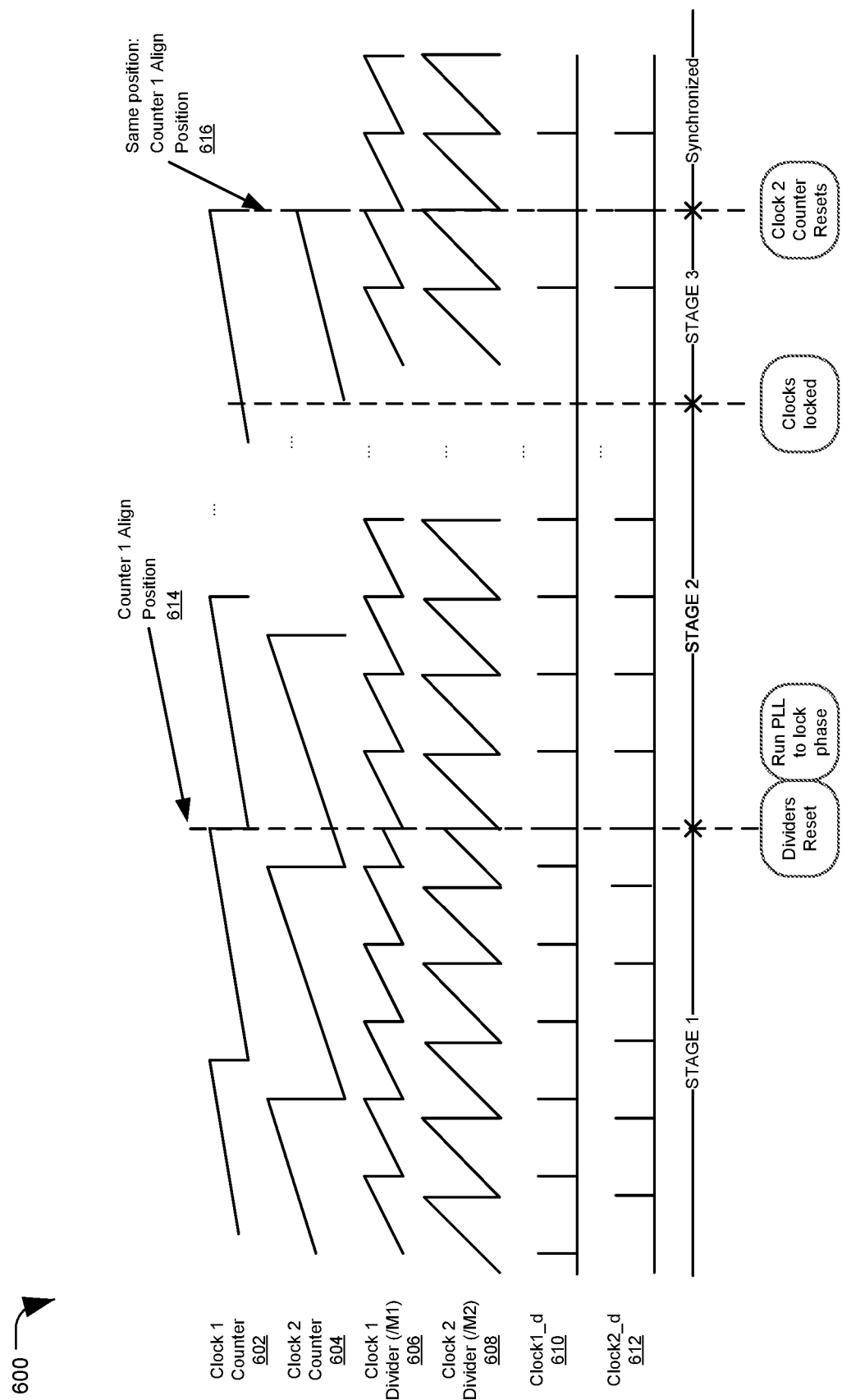
FIG. 6 is a diagram of a process of phase locking multiple clocks of different frequencies, in accordance with certain embodiments of the present disclosure.

FIG. 6 is a diagram of a process of phase locking multiple clocks of different frequencies, generally designated 600, in accordance with certain embodiments of the present disclosure. The process 600 may be performed by components of a data channel, such as a clock synchronization module (CSM) within a read/write (R/W) channel, as shown in FIG. 1.

FIG. 6 depicts a number of clock counters and clock pulses operating simultaneously along an x-axis timeline, progressing from left to right. FIG. 6 may depict a sequence of stages in which the counters and clock pulses may be aligned and synchronized.

A clock 1 counter 602 may represent a modulo counter, such as PLL1 counter 320 of FIG. 3, configured to count clock pulses from a first clock, clock 1. A clock 2 counter 604 may similarly be a modulo counter, such as PLL2 counter 322 of FIG. 3, configured to count clock pulses from a second clock, clock 2. A clock 1 divider 606, such as divider M1 326 of FIG. 3, may also be a modulo counter configured to downsample clock 1 by generating a clock pulse and resetting after a number "M1" of clock pulses have been received from clock 1. The downsampled clock 1 signals, corresponding to the pulses generated by clock 1 divider 606, may be represented by clock1_d 610. Similarly, a clock 2 divider 608, such as divider M2 328 of FIG. 3, may be a modulo counter configured to downsample clock 2 by generating a clock pulse and resetting after a number "M2" of clock pulses have been received from clock 2. The downsampled clock 2 signals, corresponding to the pulses generated by clock 2 divider 608, may be represented by clock2_d 612. For the counters, the rising edge represents the counter value getting higher, followed by it resetting to 0 at the vertical drop-offs. The higher the rising edge gets, the larger the counter number. For example, clock 2 may have a higher frequency than clock 1, and therefore the clock 2 counter 604 will get to a higher counter value than clock 1 counter 602 within the same period of time. In the example embodiment of FIG. 6, clock 1 counter 602 may count from 0 to 199, while the clock 2 counter 604 may count from 0 to 291. The downsampled clocks are to have the same frequency, and so the clock 1 divider 606 M1 value may be 50 (200/50=4), and the clock 2 divider 608 M2 value may be 73 (292/73=4).

In STAGE 1, the clock 1 counter 602 and the clock 2 counter 604 may be free-running and not synchronized at all. Each counter may be configured to count to a number corresponding to a number of corresponding clock cycles within a single disc revolution, but they may not be aligned to reset at the same point in time (and therefore not reset at the same position of the disc). Similarly, the clock 1 divider 606 and the clock 2 divider 608 have been programmed to the correct divider values (e.g. to reset at M1 and M2 received clock signals, respectively), but the reset points are not set to correspond to any particular clock 1 counter 602 or clock 2 counter 604 values. Further, the phase lock circuit may not be turned on and so the downsampled clocks are not phase aligned.

A first step of synchronization may include aligning the downsampled clocks, clock1_d 610 and clock2_d 612, to a particular position on the disc, by aligning the downsampled clocks to a particular value of the clock 1 counter 602. This particular value may be the 'counter 1 align value' 614, which may be where clock 1 counter 602 resets to 0 (e.g. as an example shown in FIG. 4, although other values may be used). The implementation of the STAGE 1 alignment of the downsampled clocks to the clock 1 counter 602 is discussed in regard to FIG. 7.

Figure 7:
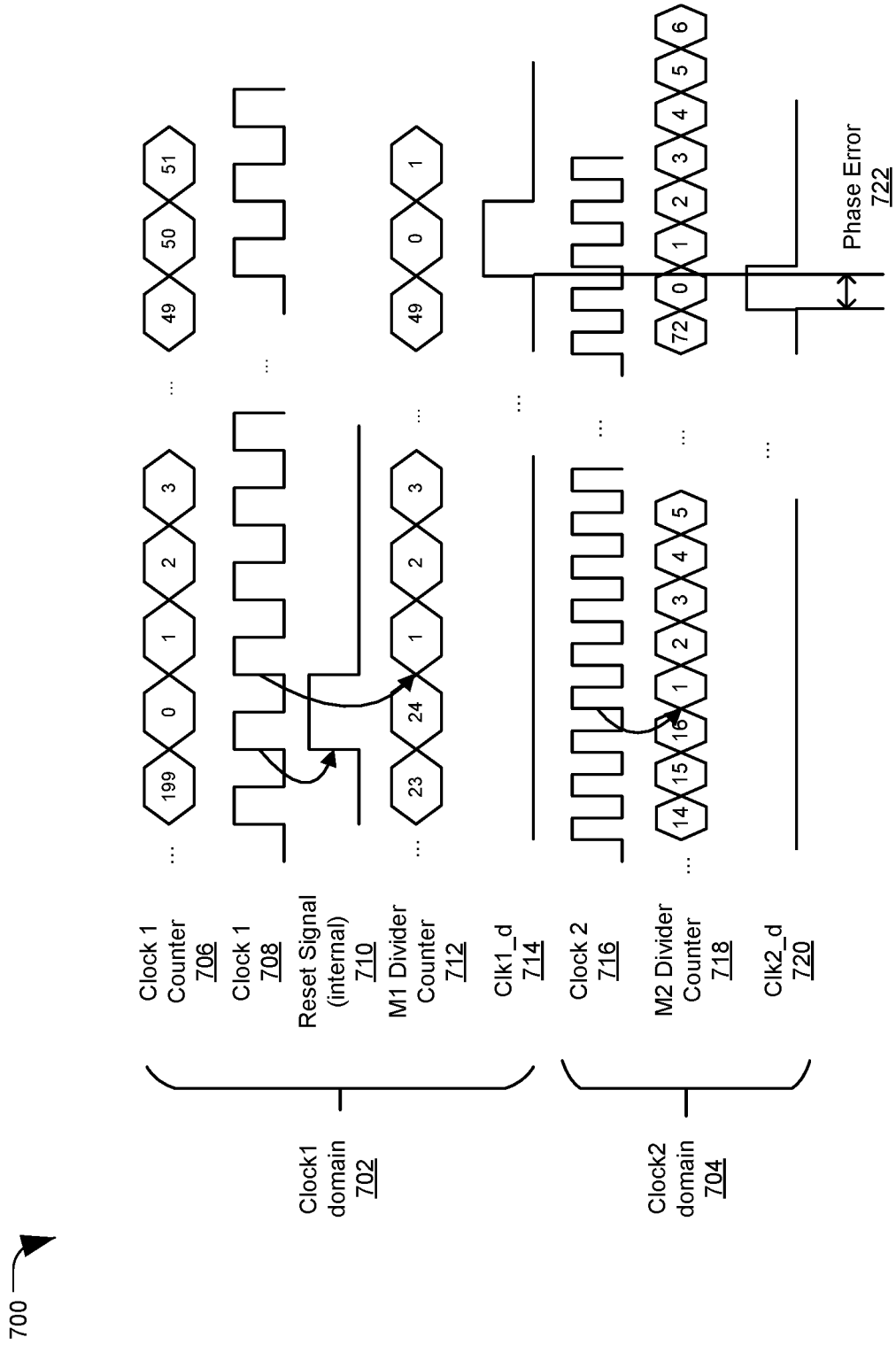
FIG. 7 is a diagram of a process of aligning downsampled clocks to a clock 1 counter value, in accordance with certain embodiments of the present disclosure.

FIG. 7 is a diagram of a process, generally designated 700, of aligning downsampled clocks to a clock 1 counter value, in accordance with certain embodiments of the present disclosure. As shown in the diagram 700, a system may have two clock domains, clock1 domain 702 and clock2 domain 704. Clock1 domain 702 may include a clock 1 counter 706, a clock 1 signal 708, a clock 1 M1 divider counter 712, and a downsampled clock signal, clk1_d 714. Clock2 domain 704 may include a clock 2 signal 716, a clock 2 M2 divider counter 718, and a downsampled clock signal, clk2_d 720.

The clock 1 counter 706 and the M1 divider counter 712 may increment at each rising edge of the clock 1 signal 708. A clk1_d 714 downsampled clock pulse may be generated each time the M1 divider counter 712 resets to 0. Similarly, the M2 divider counter 718 may increment at each rising edge of a clock 2 716, and a clk2_d 720 downsampled clock pulse may be generated each time the M2 divider counter 718 resets to 0.

To align clk1_d 714 to the clock 1 counter 706 align value (e.g. when the clock 1 counter 706 resets to zero), a synchronous reset to 1 on the M1 clock 1 divider counter 712 may be enabled when the clock 1 counter reaches the align value. That is, an internal reset signal 710 may be generated upon the clock 1 708 pulse corresponding to the clock 1 counter 706 hits the align value of 0. Upon the next clock 1 708 pulse after the reset signal 710 is generated, the M1 divider counter 712 may be reset to 1. In this manner, the timing of the M1 divider counter 712 reset point should correspond to future clock 1 counter 706 reset points. At the align value of the clock 1 counter (which is 0 in this case), there will be a clock pulse of the downsampled clock. For example, every time the clock 1 counter 706 counts to fifty (e.g. 0-49, 50-99, 100-149, 150-199) the M1 divider counter 712 will reset to 0. Although the example here has the reset signal 710 generated when the clock 1 counter 706 reaches the align value, alternate implementations are also possible. For example, the reset signal 710 could be generated when the clock 1 counter 706 reaches the align value −1, and the M1 divider counter 712 could be reset to 0 instead of 1.

For the clock 2 M2 divider 718, since the clock 2 domain 704 may be a different frequency domain than clock 1, the clock 2 716 signal may be used to sample the reset signal 710 and reset the M2 divider 718 asynchronously with the M1 divider counter 712. The reset may not occur at the exact same time due to the different frequencies. On the next clock 2 716 pulse after the reset signal 710 is generated, the M2 divider counter 718 may be reset to 1. Although both downsampled clocks may have the same frequency and may have both been reset based on the clock 1 counter 706, the difference in frequencies between clock 1 708 and clock 2 716 may result in a phase error 722 between the downsampled clock pulses. In other words, after STAGE 1 the downsampled clocks may have a different phase, but the same frequency.

Note that the example provided is just for illustration; in reality, hardware may require multiple clock 2 716 cycles to finish the asynchronous reset of the M2 divider 718. In such a case, the phase error 722 between the clk2_d 714 and clk2_d 720 might be larger, but may still be compensated for later by running the phase lock loop.

Returning to FIG. 6, the reset of the clock 1 divider 606 and the clock 2 divider 608 is illustrated at the end of STAGE 1, at the counter 1 align position 614 to correspond to where the clock 1 counter 602 resets. After resetting the dividers, STAGE 2 in the synchronization process may be to turn on the phase lock loop (e.g. phase lock loop 324 of FIG. 3) between clock 1 and clock 2. The clock 2 DPC (e.g. 318 of FIG. 3) can be adjusted until the phase of clk2_d 612 is locked to the phase of clk1_d 610. This phase adjustment may eliminate the phase error 722 depicted in FIG. 7. Once phase lock between the downsampled signals has been achieved, a phase locked signal may be generated by a phase lock detector.

At the end of STAGE 2, the downsampled clocks may be phase locked with each other, and may be aligned to the clock 1 counter 602. In addition, clock 1 and clock 2 may be phase locked at particular positions where the downsampled clock pulses are. However, the clock 2 counter 604 may not be aligned to the clock 1 counter 602. Resetting the clock 2 counter 604 to align with the clock 1 counter 602 may enable the system to align a particular value for both counters to a particular position on the disc, so that the same position is achieved every time the system loses lock and must re-lock again. The align value positions for each counter is such a fixed position for resetting. Otherwise, while the clock 1 counter 602 may always correspond to the same disc position after lock is re-established, the clock 2 counter 604 may be at, e.g. value 1 for that position during one lock, and at value 3 for the same position during a subsequent lock, introducing uncertainty. In order to align the clock 2 counter 604 to the clock 1 counter 602 at the align values shown in FIG. 4, STAGE 3 may include resetting the clock 2 counter 604 to the 'counter 2 align value' (e.g. the counter value 0) at the exact same position of the 'counter 1 align value' 616. An example implementation of the STAGE 3 alignment of the clock 2 counter 604 to the clock 1 counter 602 is discussed in regard to FIG. 8.

Figure 8:
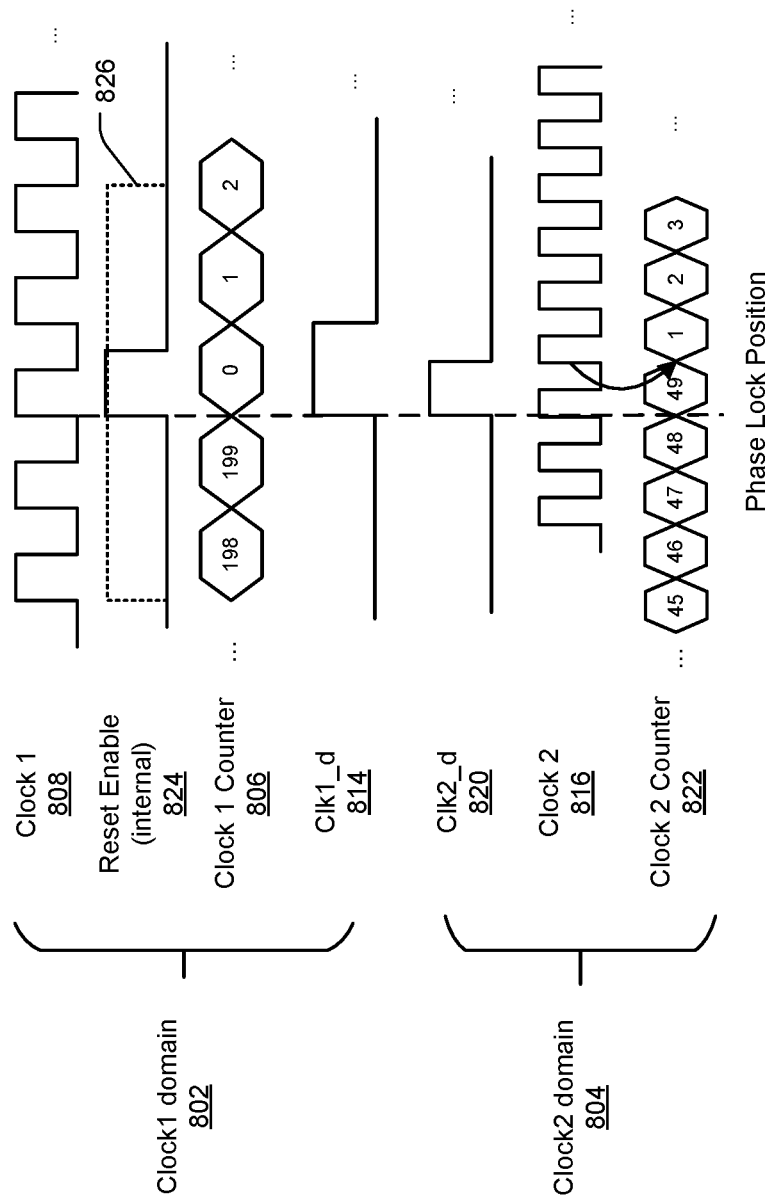
FIG. 8 is a diagram of a process of aligning a clock 2 counter value to a clock 1 counter value, in accordance with certain embodiments of the present disclosure.

FIG. 8 is a diagram of a process, generally designated 800, of aligning a clock 2 counter value to a clock 1 counter value, in accordance with certain embodiments of the present disclosure. Similar to the diagram in FIG. 7, a system of FIG. 8 may have two clock domains, clock1 domain 802 and clock2 domain 804. Clock1 domain 802 may include a clock 1 counter 806, a clock 1 signal 808, and a downsampled clock signal, clk1_d 814. Clock2 domain 804 may include a clock 2 signal 816, a clock 2 counter 822, and a downsampled clock signal, clk2_d 820.

When the first downsampled clock clk1_d 814 and the second downsampled clock clk2_d 820 are phase locked, as of the end of STAGE 2 in FIG. 6, a phase lock loop may produce a phase lock signal as shown in FIG. 3. The synchronization process may then include aligning the clock 2 counter 822 with the clock 1 counter 806 at the respective counter align values (e.g. in this example, the value "0" for each counter). A reset enable signal 824 could be triggered within the clock1 domain 802, such that a reset pulse is produced when the clock 1 counter 806 resets from 199 to 0 (or when some other selected align value for the clock 1 counter 806 is reached). The system may logically AND the reset pulse 824 and the downsampled clk2_d pulse 820 to act as a trigger to reset the clock 2 counter 822. In practice, because the reset pulse 824 is in the clock 1 domain 802 and the clk2_d 820 and clock 2 counter 822 are in the clock 2 domain 804, there could be unknown delays between two pulses. Accordingly, the reset signal 824 may actually be implemented as a longer or wider reset pulse 826, indicated with a dotted line. The system may generate a wider pulse 826 to last several clock 1 808 cycles, such that it can always cover a span that will include the clk2_d 820 pulse, allowing for the logical ANDing of the two signals. Other implementations are also possible.

Once a logical AND of the reset pulse 824 and the clk2_d 820 pulse is detected, a reset signal may be generated upon the next rising edge of the clock 2 816 signal. The clock 2 counter 822 may be set to 1 for the next cycle such that the zeros of the clock 1 counter 806 and clock 2 counter 822 are aligned. After this step, the synchronization procedure for clock 1 808 and clock 2 816 may be completed.

Returning to FIG. 6, at the end of STAGE 3 it can be seen that the clock 2 counter 604 was reset at the same time the clock 1 counter 602 reset, at the counter 1 align position 616. Since both clock 1 counter 602 and clock 2 counter 604 are configured to reset their counts after the number of corresponding clock cycles that it takes for a disc to complete a full revolution, the counter 1 align position 616 value (e.g. clock 1 counter value of "0") will always correspond to the same disc position. Since the clock 2 counter 604 is aligned to the clock 1 counter 602, the 0 values of both counters will correspond to the same position of the disc, with both clocks being phase locked and having downsampled clocks with the same frequency. In this manner, the spirals recorded to the disc can be used to accurately determine the positions of the read head and write head represented by clock 1 counter values, and because of the fixed relationship between the clock 2 counters to the clock 1 counters, represented by clock 2 counter values as well. The positioning information can be used to accurately write servo data to the desired locations on the disc The process of STAGES 1 to 3 can be performed using firmware, hardware, or any combination thereof. For example, after the firmware programs the align values (e.g. counter values "0") of clock 1 counter 602 and clock 2 counter 604, STAGES 1 and 3 may be implemented by setting reset bits, while STAGE 2 may be implemented via setting an enable bit. For example, in STAGE 1 reset bits may be used to reset the clock 1 divider (M1) 606 and the clock 2 divider (M2) 608 in response to the clock 1 counter 602 reaching the align value. STAGE 2 may be accomplished by the firmware setting an enable bit to turn on the phase lock loop and phase lock the downsampled clk2_d 612 to the downsampled clk1_d 610. STAGE 3 may include using a reset bit to reset the clock 2 counter 604 to its align value when the downsampled clocks are phase locked and the clock 1 counter 602 reaches its align value. An interrupt can be provided once the downsampled clocks are phase locked, such that the firmware can move to STAGE 3.

The implementation may be modified from the examples provided in regard to FIG. 7 and FIG. 8. However, as long as the delay between the counter 1 and counter 2 align values are fixed (as shown in FIG. 4), the synchronization may be achieved. The proposed methodology can be extended to synchronize more than two clocks, for example where several clocks are locked to one clock. An example embodiment is described in regard to FIG. 9.

Figure 9:
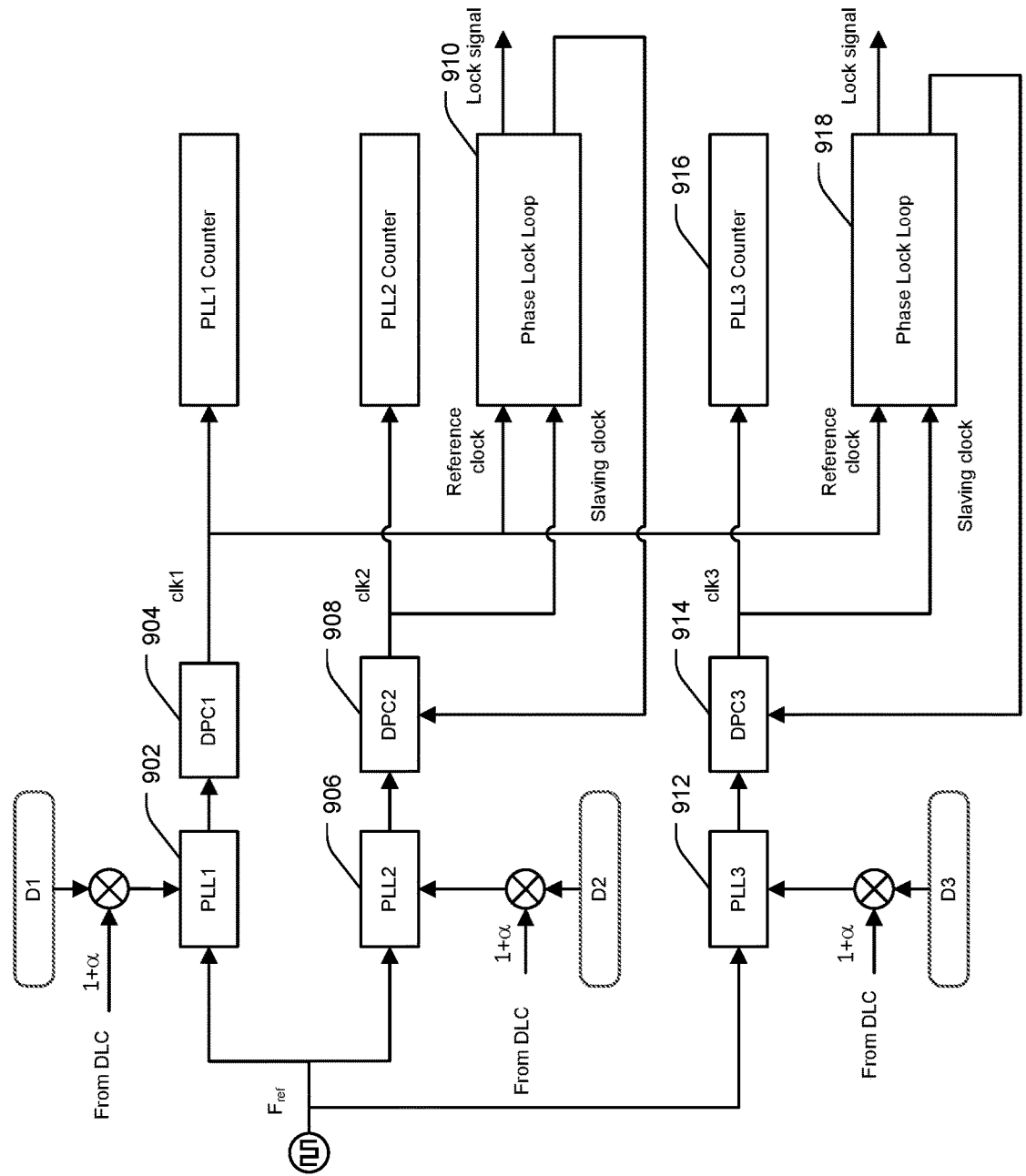
FIG. 9 is a diagram of a system configured for phase locking multiple clocks of different frequencies, in accordance with certain embodiments of the present disclosure.

FIG. 9 is a diagram of a system configured for phase locking multiple clocks of different frequencies, generally designated 900, in accordance with certain embodiments of the present disclosure. The system 900 may include an example clock synchronization module (CSM) within a read/write (R/W) channel, such as the CSM 110 of FIG. 1.

FIG. 9 depicts a system having substantially the same elements as the system described in FIG. 3, and so only a brief recap will be provided here to avoid repetition. A first PLL1 902 and a first DPC1 904 generate a first clock signal clk1, and a second PLL2 906 and a second DPC2 908 generate a second clock signal clk2. The second clock clk2 may be synchronized to clk1 via a first phase lock loop 910 as described herein, with clk1 being the master clock and clk2 being the slaving clock.

The system can be extended to include a third PLL3 912 and a third DPC3 914 to generate a third clock signal clk3, with a third modulo counter PLL3 counter 916. The third clock clk3 may have a different frequency than clk1 and clk2. Clk3 may be synchronized to clk1 by providing both signals to a second phase lock loop 918, and following the same methodology as described to synchronize clk2 to clk1. As clk1 is the reference clock in both instances and does not have its phase or PLL1 counter changed during the synchronization process, multiple clocks can be synchronized to clk1 in this manner.

In a SSW procedure, two writing channels (e.g. including PLL2 906 and PLL3 912) can be synchronized to one reading channel (e.g. including PPL1 902) for example, such that servo patterns can be written on two disc surfaces at the same time (or staggered). A single spiral pattern on one disc surface can be read by the single read channel and used to record servo data on multiple disc surfaces. The two writing clocks can have totally different frequencies. In this way, the servo writing time can be substantially improved.

Figure 10:
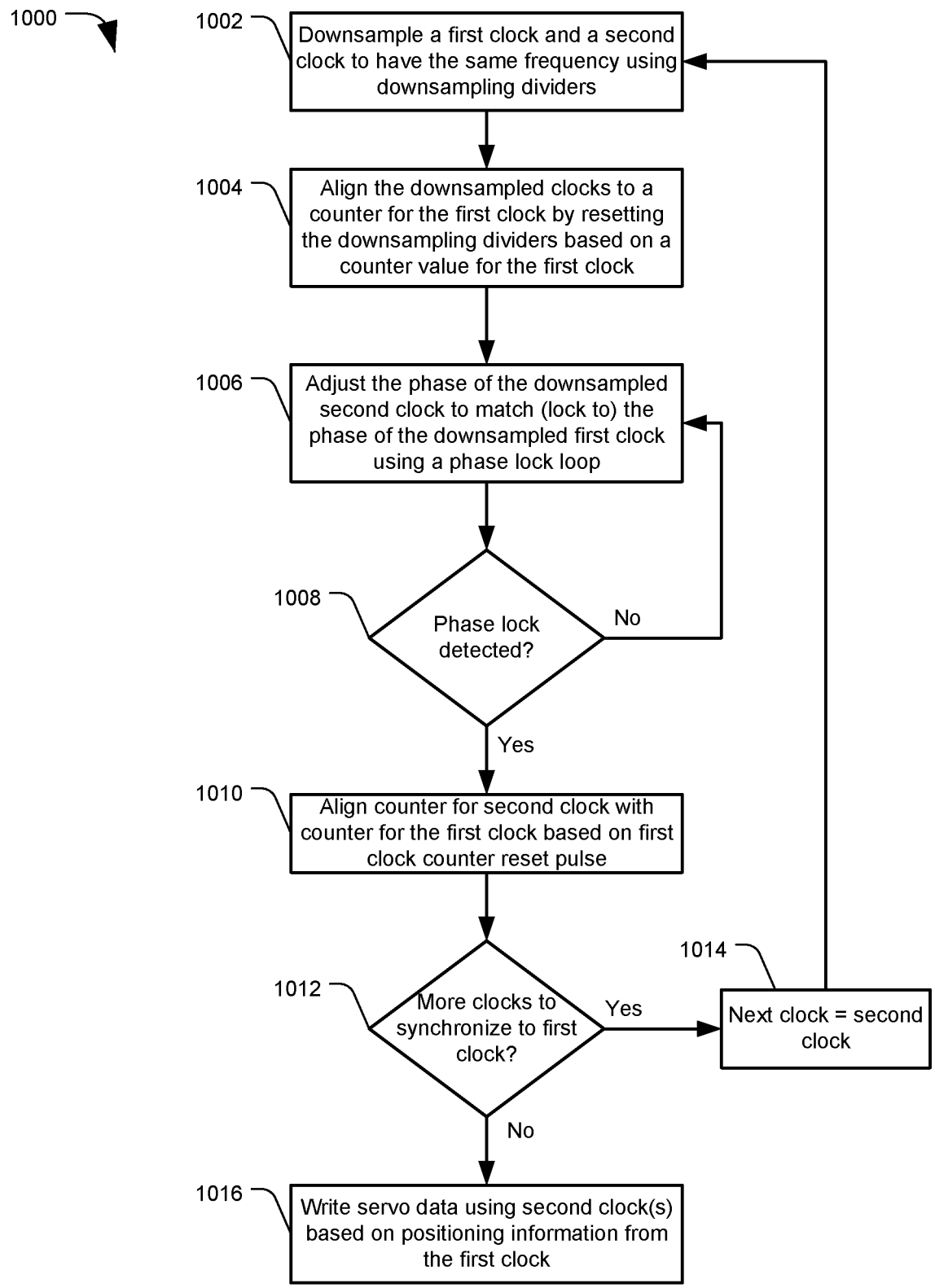
FIG. 10 is a flowchart of a method of phase locking multiple clocks of different frequencies, in accordance with certain embodiments of the present disclosure.

Turning now to FIG. 10, a flowchart of a method of phase locking multiple clocks of different frequencies, generally designated 1000, is described in accordance with certain embodiments of the present disclosure. The method 1000 may be performed by circuits, computer-executable instructions, or any combination thereof, such as by the clock synchronization module (CSM) 110 depicted in FIG. 1.

Method 1000 may include downsampling a first clock and a second clock having different frequencies to generate downsampled clocks having the same frequency, for example using digital dividers, at 1002. The downsampled clocks may be alilgned to a counter value for the first clock by resetting the downsampling divider counters based on a counter value for the first clock, at 1004. For example, when the counter for the first clock resets to 0, the divider counters for the downsampled signals may both be reset so that their 0 counter values will align with the first clock counter value of 0. In this manner, the downsampled clocks may have a same frequency and be aligned with the first clock counter, but may be offset in phase.

At 1006, the method 1000 may include adjusting the phase of the downsampled second clock to match, or "lock to", the phase of the downsampled first clock using a phase lock loop. The phase lock loop may determine a phase error between the downsampled clock signals, and adjust the phase of the second clock based on the error until the phases of the downsampled clocks are aligned. A determination may be made whether a phase lock is detected between the downsampled clocks, at 1008. If not, the method 1000 may include continuing to adjust the phase of the second clock via the phase lock loop, at 1006.

When a phase lock is detected, at 1008, the method 1000 may include aligning a counter for the second clock with the counter for the first clock based on a reset pulse from the first clock counter, at 1010. For example, when the counter for the first clock resets to 0, a reset pulse may be generated. In response to the reset pulse, the counter for the second clock counter may be set to a value (e.g. the value "1") so that the 0 values for both counters will be aligned.

A determination may be made whether there are more clocks to synchronize to the first clock, at 1012. If there are, a next clock may be selected as the "second clock", at 1014, and the method may repeat at 1002. If there are no additional clocks to synchronize to the first clock, at 1012, the method 1000 may include writing servo data to discs using the one or more second clock(s) based on positioning information from the first clock, at 1016. An example data storage device incorporating a read/write (R/W) channel having a clock synchronization module (CSM) configured to perform the clock synchronization operations described herein is shown in FIG. 11.

Figure 11:
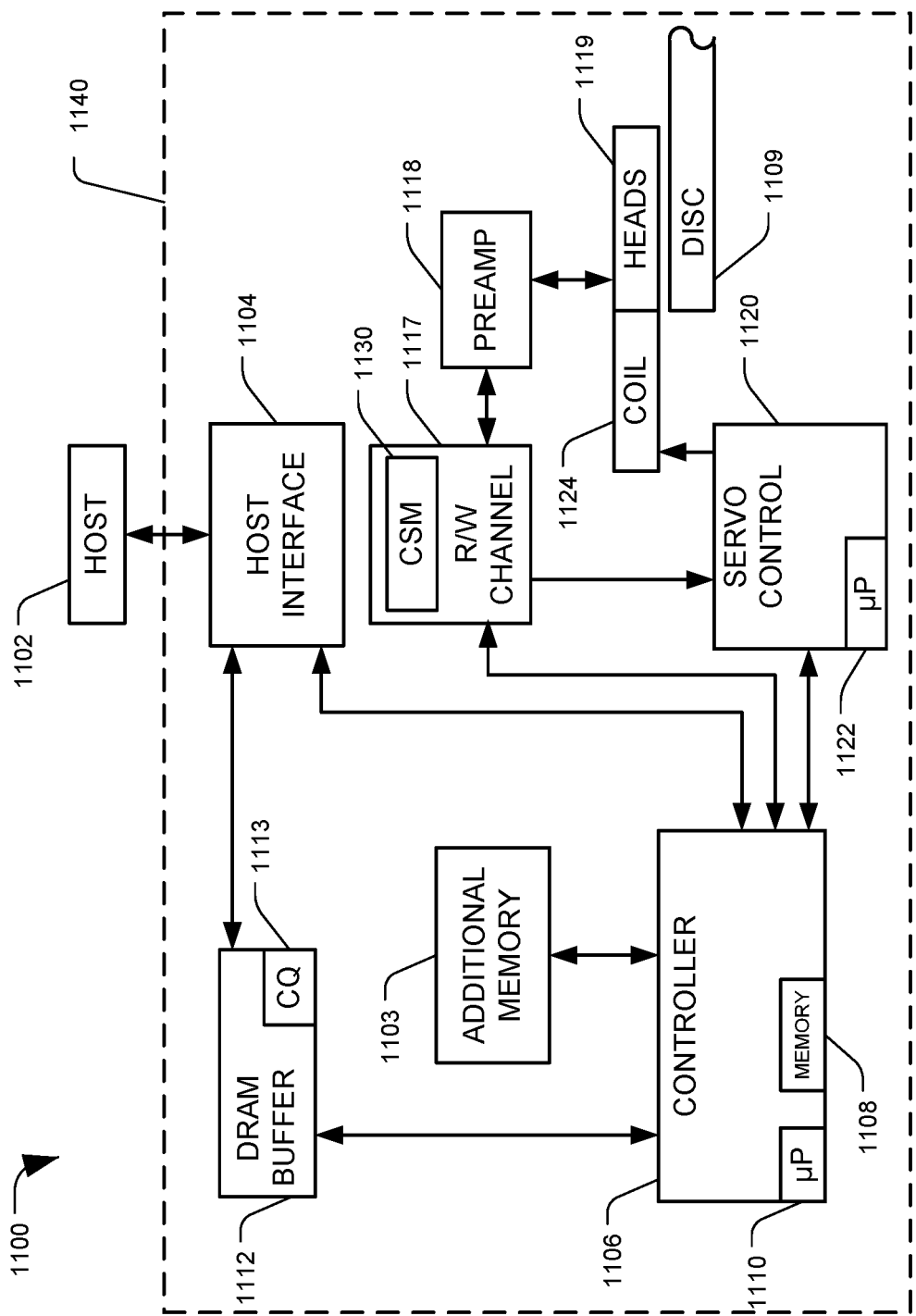
FIG. 11 is a diagram of a system configured for phase locking multiple clocks of different frequencies, in accordance with certain embodiments of the present disclosure.

FIG. 11 is a diagram of a system configured for phase locking multiple clocks of different frequencies, generally designated 1100, in accordance with certain embodiments of the present disclosure. Specifically, FIG. 11 provides a functional block diagram of an example data storage device (DSD) 1100, which may be an example of the DSD 104 of FIG. 1. The DSD 1100 may perform operations involving multiple clocks having different frequencies, such as self-servo writing operations.

The DSD 1100 can communicate with a host device 1102 (such as the host system 102 shown in FIG. 1) via a hardware or firmware-based interface circuit 1104. The interface 1104 may comprise any interface that allows communication between a host 1102 and a DSD 1100, either wired or wireless, such as USB, IEEE 1394, Compact Flash, SATA, eSATA, PATA, SCSI, SAS, PCIe, Fibre Channel, Ethernet, or Thunderbolt, among others. The interface 1104 may include a connector (not shown) that allows the DSD 1100 to be physically removed from the host 1102. The DSD 1100 may have a casing 1140 housing the components of the DSD 1100, or the components of the DSD 1100 may be attached to the housing, or a combination thereof.

The buffer 1112 can temporarily store data during read and write operations, and can include a command queue (CQ) 1113 where multiple pending operations can be temporarily stored pending execution. Commands arriving over the interface 1104 may automatically be received in the CQ 1113 or may be stored there by controller 1106, interface 1104, or another component.

The DSD 1100 can include a programmable controller 1106, which can include associated memory 1108 and processor 1110. The controller 1106 may control data access operations, such as reads and writes, to one or more disc memories 1109. The DSD 1100 may include an additional memory 1103 instead of or in addition to disc memory 1109. For example, additional memory 1103 can be a solid state memory, which can be either volatile memory such as DRAM or SRAM, or non-volatile memory, such as NAND Flash memory. The additional memory 1103 can function as a cache and store recently or frequently read or written data, or data likely to be read soon. Additional memory 1103 may also function as main storage instead of or in addition to disc(s) 1109. A DSD 1100 containing multiple types of nonvolatile storage mediums, such as a disc(s) 1109 and Flash 1103, may be referred to as a hybrid storage device.

The DSD 1100 can include a read-write (R/W) channel 1117, which can encode data during write operations and reconstruct user data retrieved from a memory, such as disc(s) 1109, during read operations. A preamplifier circuit (preamp) 1118 can apply write currents to the heads 1119 and provides pre-amplification of read-back signals. In some embodiments, the preamp 1118 and heads 1119 may be considered part of the R/W channel 1117. A servo control circuit 1120 may use servo data to provide the appropriate current to the coil 1124, sometimes called a voice coil motor (VCM), to position the heads 1119 over a desired area of the disc(s) 1109. The controller 1106 can communicate with a processor 1122 to move the heads 1119 to the desired locations on the disc(s) 1109 during execution of various pending I/O commands in the command queue 1113.

DSD 1100 may include one or more clock synchronization modules (CSMs) 1130, for example in the R/W channel 1117, distributed among multiple components, as one or more stand-alone circuits, or any combination thereof. The CSM 1130 may perform the methods and processes described herein to synchronize multiple clocks having different frequencies. For example, different heads 1119 may be controlled according to different clock frequencies. The CSM 1130 may downsample the clocks so that the downsampled clock signals share a same frequency, phase lock the downsampled clocks, and align the clock counters and digital dividers so that the clocks are fully synchronized. The synchronized clocks may be used to perform techniques such as self-servo writing of servo data to the disc(s) 1109 in a manner that allows for writing data to precise locations on a disc's surface even in the absence of pre-written servo data.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a data channel including a clock synchronization module (CSM) having:
        a first clock circuit configured to produce a first clock signal having a first frequency;
        a second clock circuit, not derived from the first clock circuit, configured to produce a second clock signal having a second frequency different from the first frequency;
        a first clock counter to generate a first counter value representing clock cycles from the first clock signal;
        a first digital divider circuit configured to downsample the first clock signal to produce a first downsampled clock signal having a third frequency, the first digital divider circuit downsampling the first clock signal based on generating a second counter value corresponding to the first clock signal;
        a second digital divider circuit configured to downsample the second clock signal to produce a second downsampled clock signal having the third frequency, the second digital divider circuit downsampling the second clock signal based on generating a third counter value corresponding to the second clock signal;
        a phase lock loop configured to synchronize phases of the first downsampled clock signal and the second downsampled clock signal by adjusting a phase of the second clock signal via the second clock circuit based on a phase error between the first downsampled clock signal and the second downsampled clock signal;
    the data channel configured to:
        synchronize the first digital divider circuit and the second digital divider circuit to the first clock counter so that the first counter value of the first clock counter, the second counter value of the first digital divider circuit, and the third counter value of the second digital divider circuit are aligned; and
        perform data access to a memory after synchronization using the first clock signal and the second clock signal.

2. The apparatus of claim 1 further comprising:
    the data channel further including:
        the first digital divider configured to produce the first downsampled clock signal based on counting clock cycles from the first clock signal and outputting a first clock pulse after a first selected number of counted clock cycles;
        the second digital divider configured to produce the second downsampled clock signal based on counting clock cycles from the second clock signal and outputting a second clock pulse after a second selected number of counted clock cycles.

3. The apparatus of claim 2 further comprising:
the first clock counter, the first digital divider, and the second digital divider include modulo counters that count to a respective counter value and then reset; and
the data channel is configured to synchronize the second counter value of the first digital divider and the third counter value of the second digital divider to the first counter value of the first clock counter by setting the second counter value and the third counter value to selected counter values when the first clock counter resets.

4. The apparatus of claim 3 further comprising:
the CSM further includes a second clock counter to generate a fourth counter value representing clock cycles from the second clock signal; and
the data channel further configured to synchronize the fourth counter value of the second clock counter to the first counter value of the first clock counter so that counter values of the first clock counter and the second clock counter are aligned.

5. The apparatus of claim 4 further comprising:
the memory includes a disc memory;
the first clock counter configured to count a first number of clock cycles from the first clock signal corresponding to a full revolution of the disc;
the second clock counter configured to count a second number of clock cycles from the second clock signal corresponding to the full revolution of the disc; and
particular values of the first counter value and the second counter value will always correspond to particular locations on a given track of the disc.

6. The apparatus of claim 5 further comprising:
the CSM further including:
a third clock circuit configured to produce a third clock signal having a fourth frequency;
a third digital divider circuit to downsample the third clock signal to produce a third downsampled clock signal having the third frequency; and
the data channel further configured to synchronize the third digital divider to the first clock counter so that the counter values of the first clock counter and the third digital divider are aligned.

7. The apparatus of claim 6 further comprising:
the disc memory is recorded with spiral patterns including sync mark data;
the data channel further configured to:
determine positioning information for a head over the disc memory based on the spiral patterns and the first clock counter; and
record servo data to the disc memory based on the positioning information.

8. The apparatus of claim 7 further comprising:
the first clock signal corresponds to a read head;
the second clock signal corresponds to a write head;
the data channel is further configured to:
determine the positioning information using the read head and the spiral patterns; and
record the servo data using the write head.

9. An apparatus comprising:
a data channel including a clock synchronization module (CSM) having:
a first clock counter to generate a first counter value representing clock cycles from a first clock signal from a first clock circuit having a first frequency;
a first digital divider circuit configured to downsample the first clock signal to produce a first downsampled clock signal having a third frequency, the first digital divider circuit downsampling the first clock signal based on generating a second counter value corresponding to the first clock signal;
a second digital divider circuit configured to downsample a second clock signal from a second clock circuit having a second frequency to produce a second downsampled clock signal having the third frequency, the second digital divider circuit downsampling the second clock signal based on generating a third counter value corresponding to the second clock signal;
a phase lock loop configured to synchronize phases of the first downsampled clock signal and the second downsampled clock signal by adjusting a phase of the second clock signal based on a phase error between the first downsampled clock signal and the second downsampled clock signal;
the data channel configured to:
synchronize the first digital divider circuit and the second digital divider circuit to the first clock counter so that the first counter value of the first clock counter, the second counter value of the first digital divider circuit, and the third counter value of the second digital divider circuit are aligned; and
perform data access to a memory after synchronization using the first clock signal and the second clock signal.

10. The apparatus of claim 9 further comprising:
the data channel further including:
the first digital divider configured to produce the first downsampled clock signal based on counting clock cycles from the first clock signal and outputting a first clock pulse after a first selected number of counted clock cycles; and
the second digital divider configured to produce the second downsampled clock signal based on counting clock cycles from the second clock signal and outputting a second clock pulse after a second selected number of counted clock cycles.

11. The apparatus of claim 10 further comprising:
the first clock counter, the first digital divider, and the second digital divider include modulo counters that count to a respective counter value and then reset; and
the data channel is configured to synchronize the second counter value of the first digital divider and the third counter value of the second digital divider to the first counter value of the first clock counter by setting the second counter value and the third counter value to selected counter values when the first clock counter resets.

12. The apparatus of claim 10 further comprising:
the CSM further includes a second clock counter to generate a fourth counter value representing clock cycles from the second clock signal; and
the data channel further configured to synchronize the fourth counter value of the second clock counter to the first counter value of the first clock counter so that counter values of the first clock counter and the second clock counter are aligned.

13. The apparatus of claim 12 further comprising:
the memory includes a disc memory;
the first clock counter configured to count a first number of clock cycles from the first clock signal corresponding to a full revolution of the disc;

the second clock counter configured to count a second number of clock cycles from the second clock signal corresponding to the full revolution of the disc; and particular values of the first counter value and the second counter value will always correspond to particular locations on a given track of the disc.

14. The apparatus of claim 13 further comprising:
the disc memory is recorded with spiral patterns including sync mark data;
the data channel further configured to:
    determine positioning information for a head over the disc memory based on the spiral patterns and the first clock counter; and
    record servo data to the disc memory based on the positioning information.

15. The apparatus of claim 14 further comprising:
the first clock signal corresponds to a read head;
the second clock signal corresponds to a write head; and
the data channel is further configured to:
    determine the positioning information using the read head and the spiral patterns; and
    record the servo data using the write head.

16. The apparatus of claim 10 further comprising:
the CSM further including:
    a third clock circuit configured to produce a third clock signal having a fourth frequency;
    a third digital divider circuit to downsample the third clock signal to produce a third downsampled clock signal having the third frequency; and
the data channel further configured to synchronize the third digital divider to the first clock counter so that the counter values of the first clock counter and the third digital divider are aligned.

17. A method comprising:
generating a first clock signal having a first frequency using a first clock circuit;
generating a second clock signal having a second frequency using a second clock circuit;
generating a first clock counter value representing clock cycles from the first clock signal via a first clock counter;
downsampling the first clock signal via a first digital divider circuit to produce a first downsampled clock signal having a third frequency, based on generating a second counter value corresponding to the first clock signal;
downsampling the second clock signal via a second digital divider circuit to produce a second downsampled clock signal having the third frequency, based on generating a third counter value corresponding to the second clock signal;

synchronizing phases of the first downsampled clock signal and the second downsampled clock signal via a phase lock loop circuit by adjusting a phase of the second clock signal based on a phase error between the first downsampled clock signal and the second downsampled clock signal;

synchronizing the first digital divider and the second digital divider to the first clock counter so that the first counter value of the first clock counter, the second counter value of the first digital divider, and the third counter value of the second digital divider are aligned, based on the first counter value reaching a selected align value; and performing data access to a memory after synchronization using the first clock signal and the second clock signal.

18. The method of claim 17 further comprising:
producing the first downsampled clock signal at the first digital divider based on counting clock cycles from the first clock signal and outputting a first clock pulse after a first selected number of counted clock cycles;
producing the second downsampled clock signal at the second digital divider based on counting clock cycles from the second clock signal and outputting a second clock pulse after a second selected number of counted clock cycles.

19. The method of claim 18 further comprising:
counting clock cycles from the second clock signal via a second clock counter to obtain a fourth counter value; and
synchronizing the second clock counter to the first clock counter so that the first counter value of the first clock counter and the fourth counter value of the second clock counter are aligned.

20. The method of claim 19 further comprising:
the memory includes a disc memory recorded with spiral patterns including sync mark data;
counting, via the first clock counter, a first number of clock cycles from the first clock signal corresponding to a full revolution of the disc memory;
counting, via the second clock counter, a second number of clock cycles from the second clock signal corresponding to the full revolution of the disc, wherein particular values of the first counter value and the fourth counter value will always correspond to particular locations on a given track of the disc;
determining positioning information for a head over the disc memory based on the spiral patterns and the first clock counter; and
recording servo data to the disc memory based on the positioning information.

* * * * *